US010964402B1

(12) United States Patent
Chen et al.

(10) Patent No.: US 10,964,402 B1
(45) Date of Patent: Mar. 30, 2021

(54) REPROGRAMMING MEMORY CELLS TO TIGHTEN THRESHOLD VOLTAGE DISTRIBUTIONS AND IMPROVE DATA RETENTION

(71) Applicant: SanDisk Technologies LLC, Addison, TX (US)

(72) Inventors: Han-Ping Chen, Santa Clara, CA (US); Henry Chin, Fremont, CA (US); Ashish Baraskar, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/794,614

(22) Filed: Feb. 19, 2020

(51) Int. Cl.
G11C 16/04 (2006.01)
G11C 16/34 (2006.01)
G11C 16/10 (2006.01)
G11C 16/26 (2006.01)
H01L 27/1157 (2017.01)
G11C 11/56 (2006.01)
G11C 16/08 (2006.01)

(52) U.S. Cl.
CPC ...... *G11C 16/3459* (2013.01); *G11C 16/0483* (2013.01); *G11C 16/10* (2013.01); *G11C 16/26* (2013.01); *G11C 11/5671* (2013.01); *G11C 16/08* (2013.01); *H01L 27/1157* (2013.01)

(58) Field of Classification Search
CPC . G11C 16/3459; G11C 16/0483; G11C 16/10; G11C 16/26; G11C 11/5671; G11C 16/08; H01L 27/1157

USPC .................................................. 365/185.17
See application file for complete search history.

(56) References Cited

U.S. PATENT DOCUMENTS

| 9,336,891 B2 | 5/2016 | Yuan et al. |
| 9,343,141 B2 | 5/2016 | Pang et al. |
| 9,595,342 B2 | 3/2017 | Pang et al. |
| 2006/0285396 A1 | 12/2006 | Ha |
| 2010/0091573 A1 | 4/2010 | Li et al. |

(Continued)

FOREIGN PATENT DOCUMENTS

DE 102012109612 A1 4/2013

OTHER PUBLICATIONS

U.S. Appl. No. 16/257,074, filed Jan. 25, 2019.

(Continued)

*Primary Examiner* — Huan Hoang
(74) *Attorney, Agent, or Firm* — Vierra Magen Marcus LLP

(57) ABSTRACT

Techniques are described for reprogramming memory cells to tighten threshold voltage distributions and improve data retention. In one aspect, the memory cells of a word line WLn are reprogrammed after programming of memory cells of an adjacent, later-programmed word line WLn+1. The reprogramming can be limited to lower state memory cells of WLn which are adjacent to lower state memory cells of WL+1. A program pulse magnitude used in the reprogramming can be tailored to the data states of the WLn memory cell and the adjacent, WLn+1 memory cell. In some cases, the program pulse magnitudes can be grouped to reduce the implementation complexity and time. The reprogramming can occur after an initial program operation has completed, during an idle time of a control circuit.

20 Claims, 27 Drawing Sheets

(56) References Cited

U.S. PATENT DOCUMENTS

2014/0146605 A1* 5/2014 Yang .................... G06F 3/0679
            365/185.03
2017/0110185 A1* 4/2017 Hahn ................. G11C 16/0483

OTHER PUBLICATIONS

International Search Report & the Written Opinion of the International Searching Authority dated Sep. 17, 2020, International Application No. PCT/US2020/035018.
English Abstract of DE Publication No. DE102012109612 published Apr. 18, 2013.

* cited by examiner

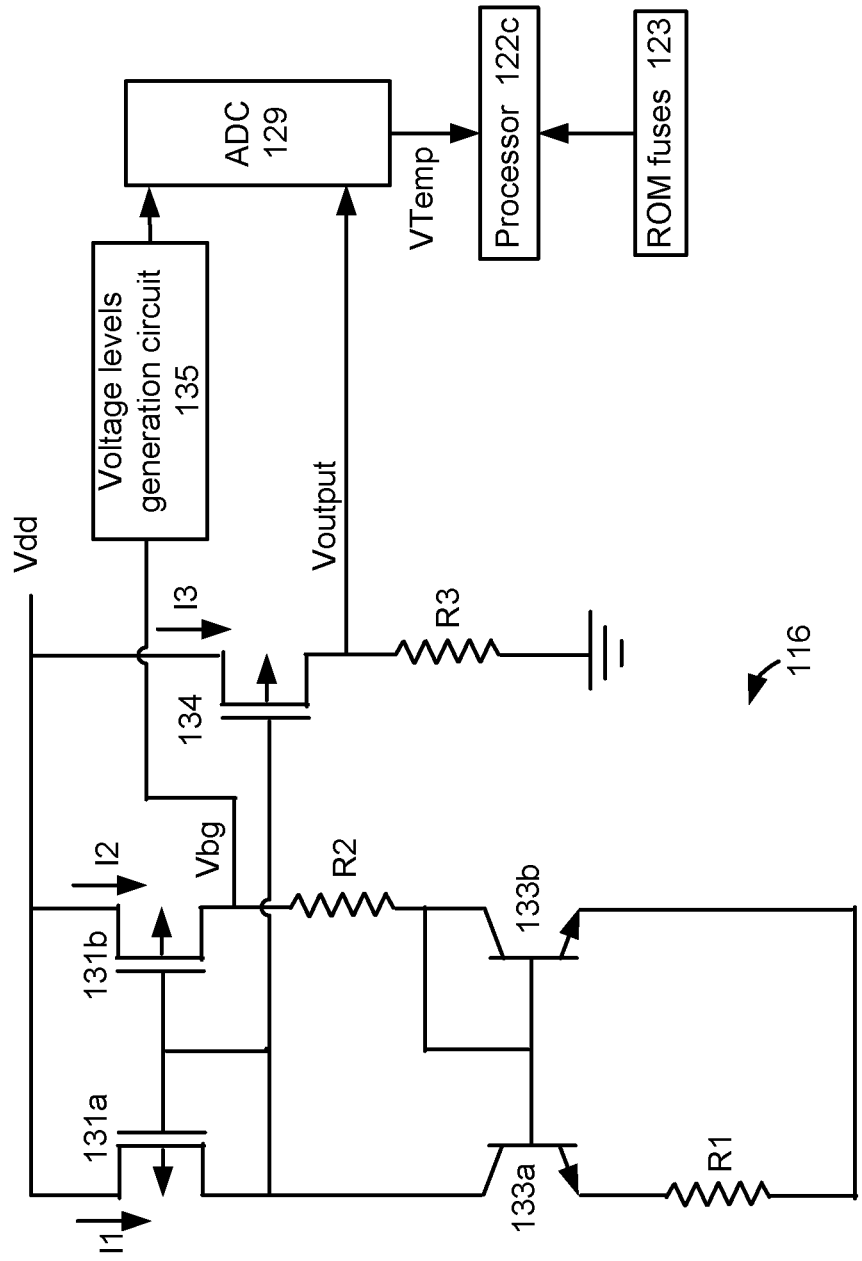

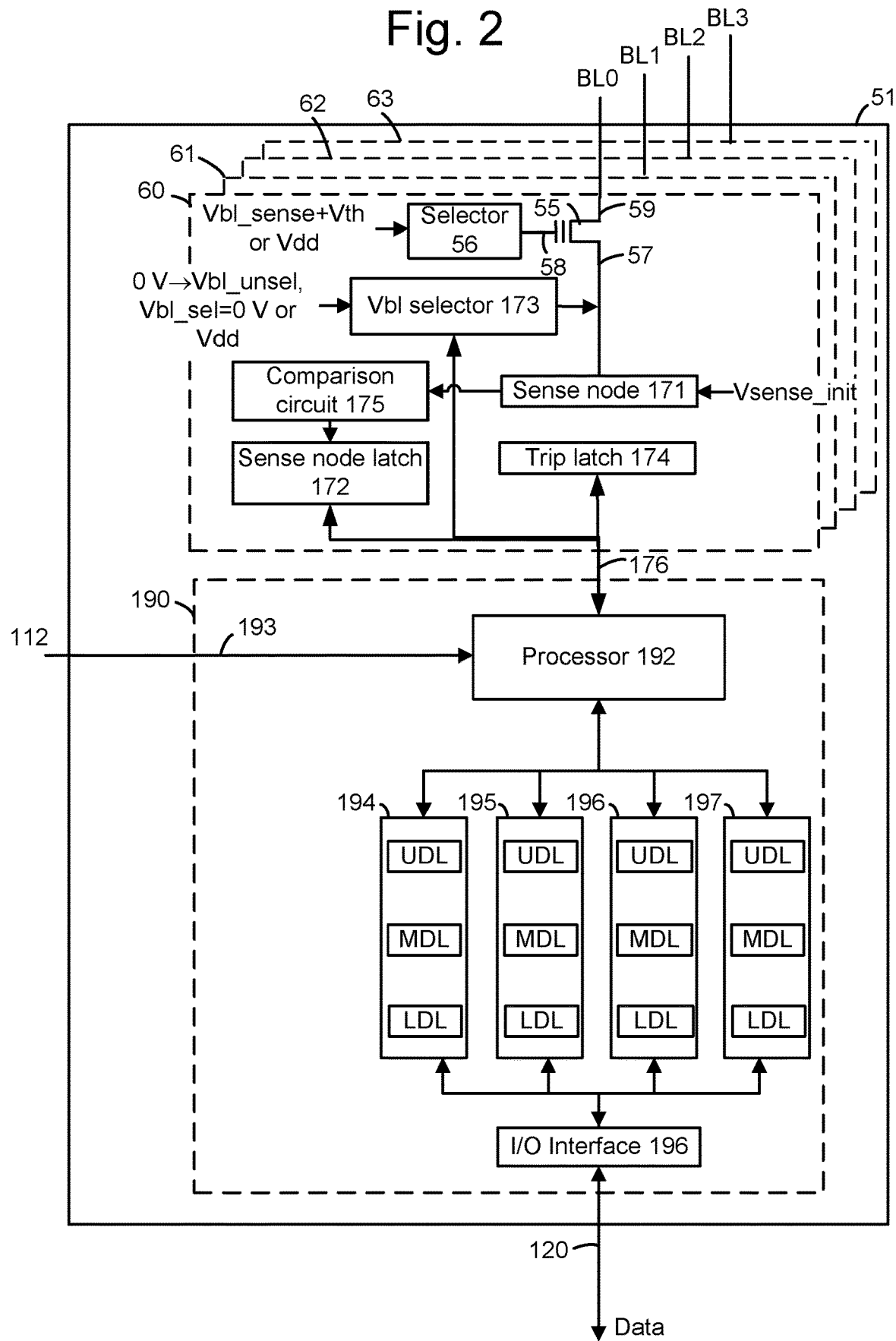

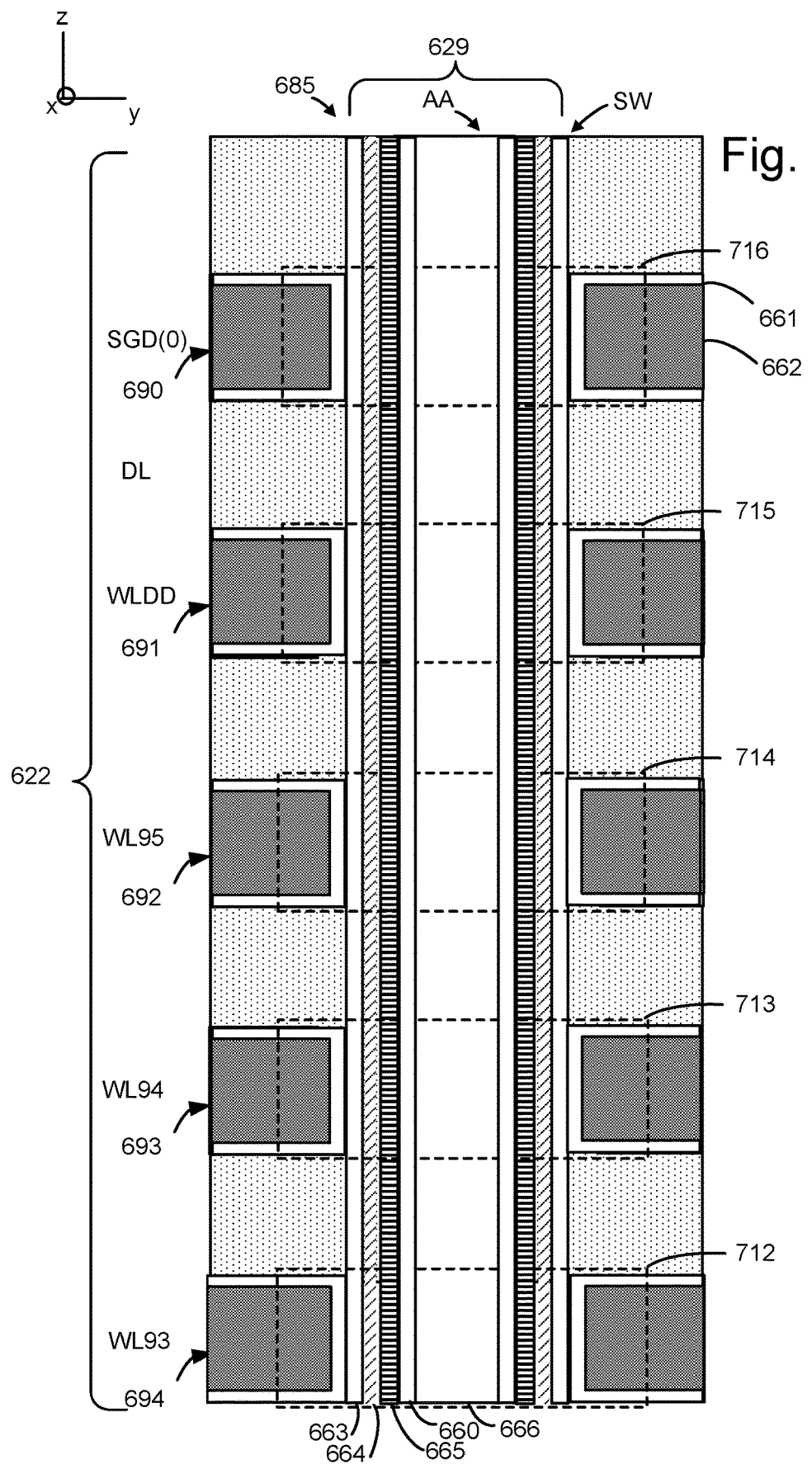

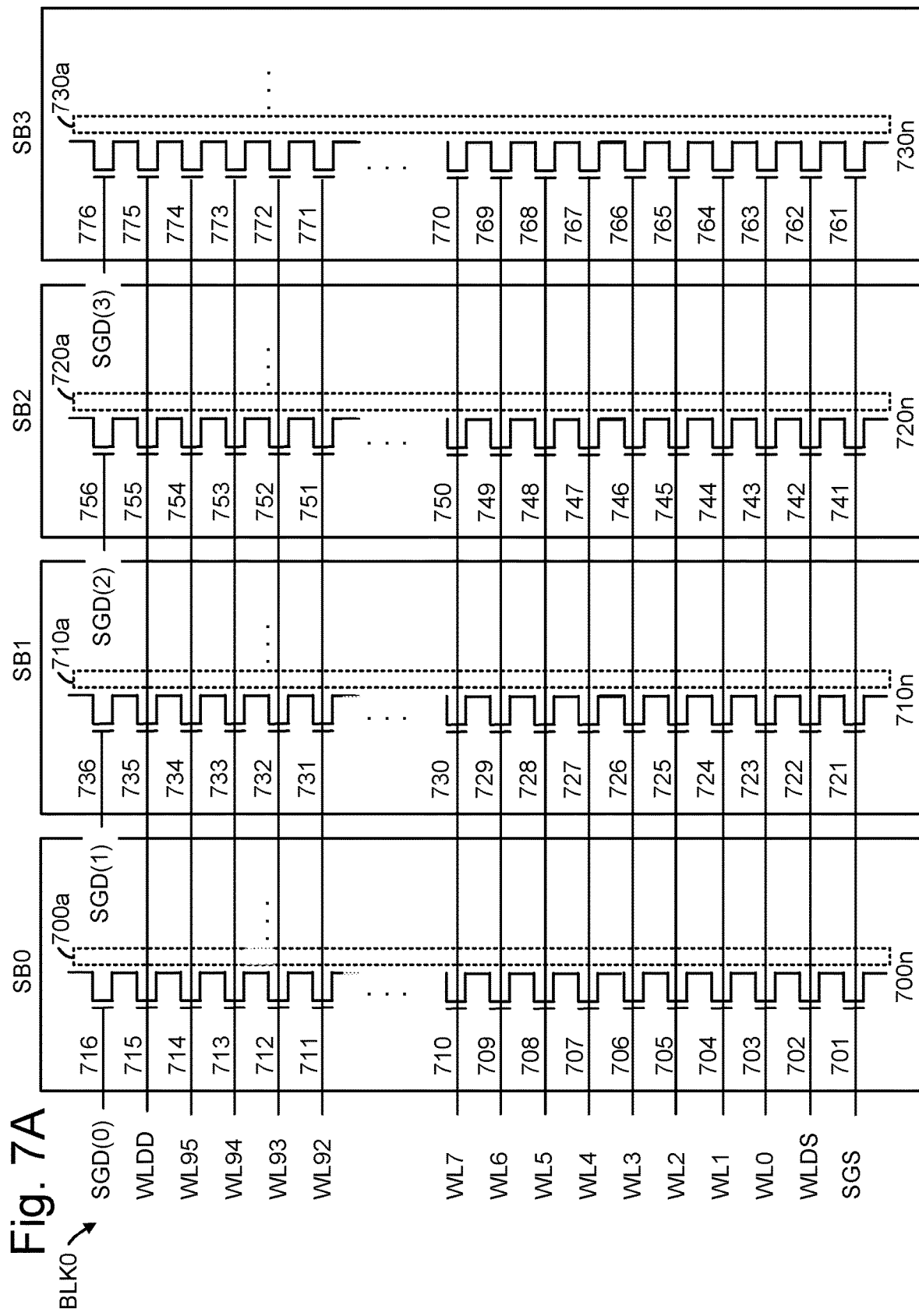

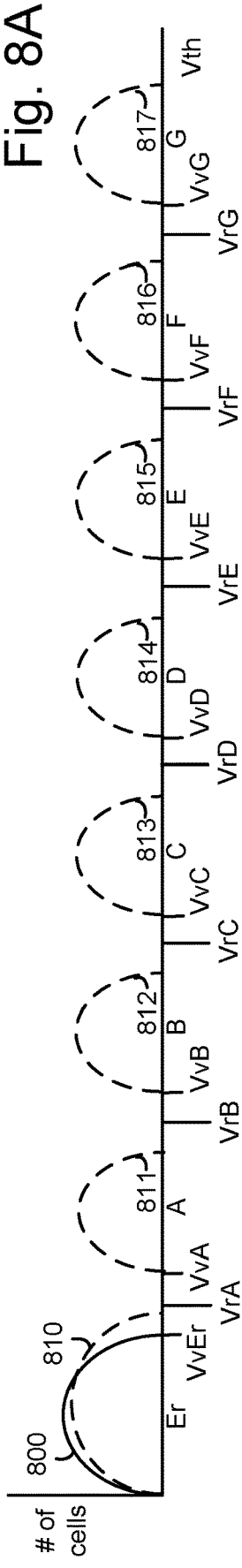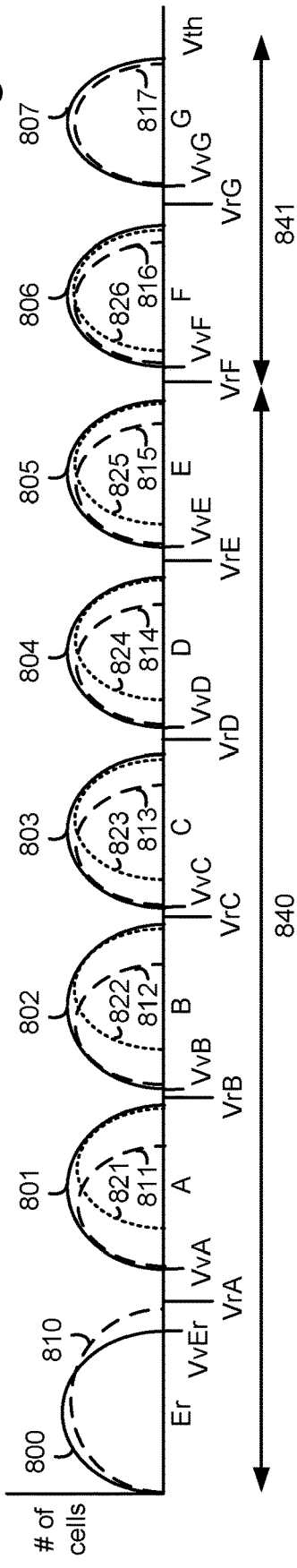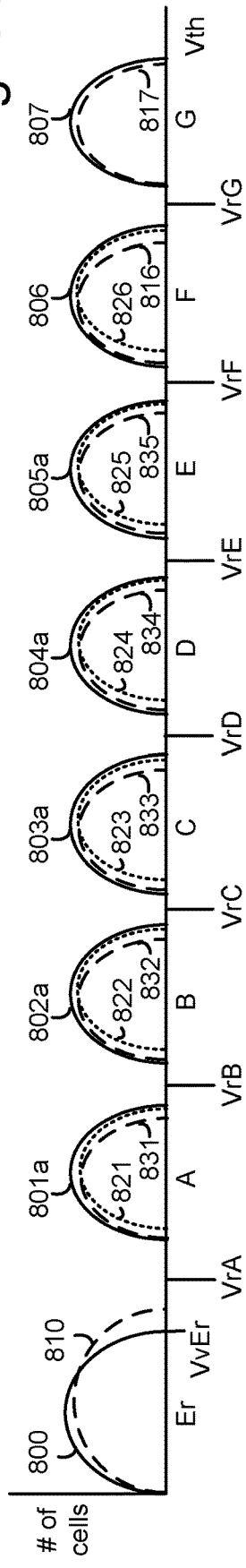

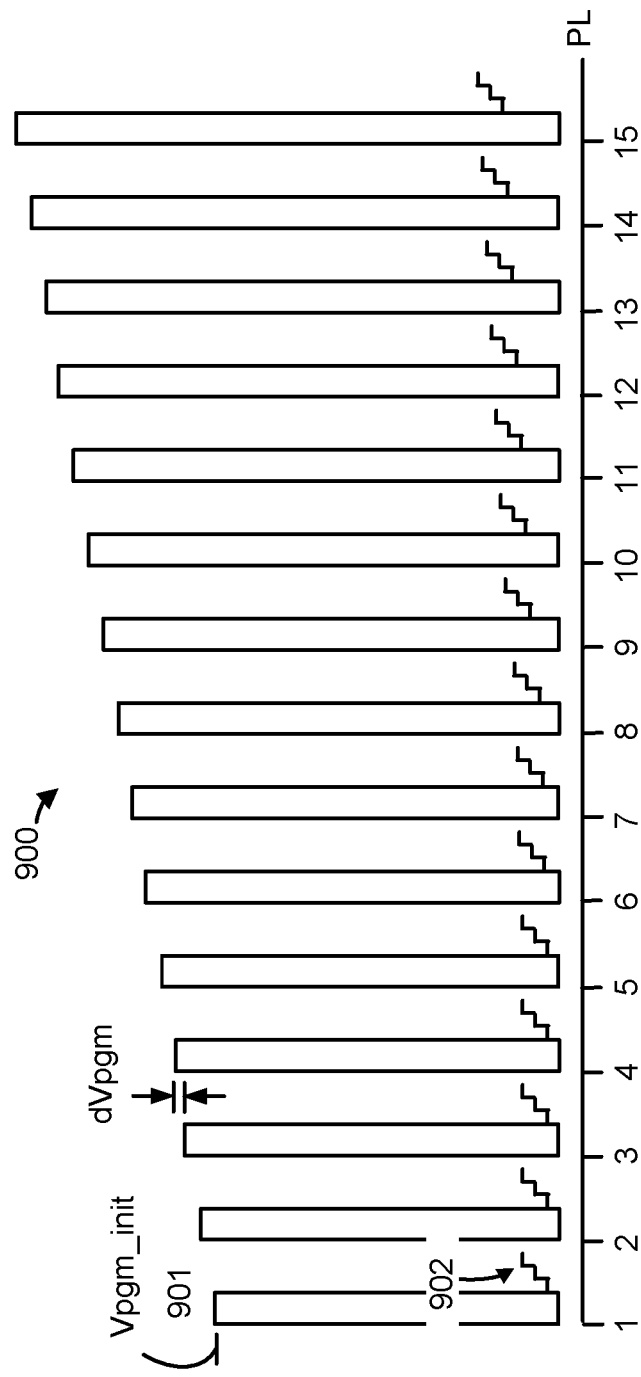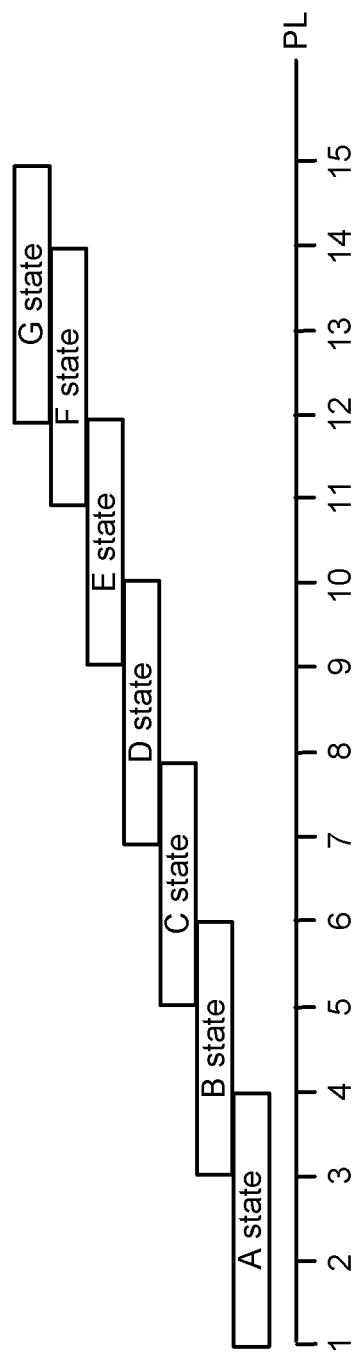

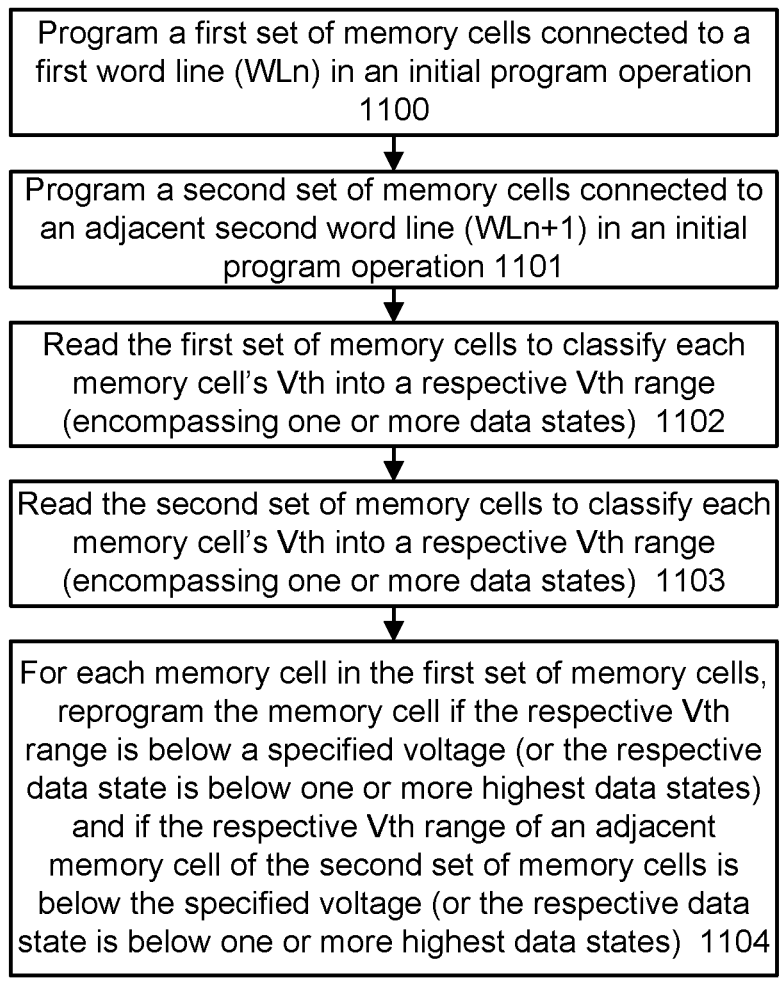

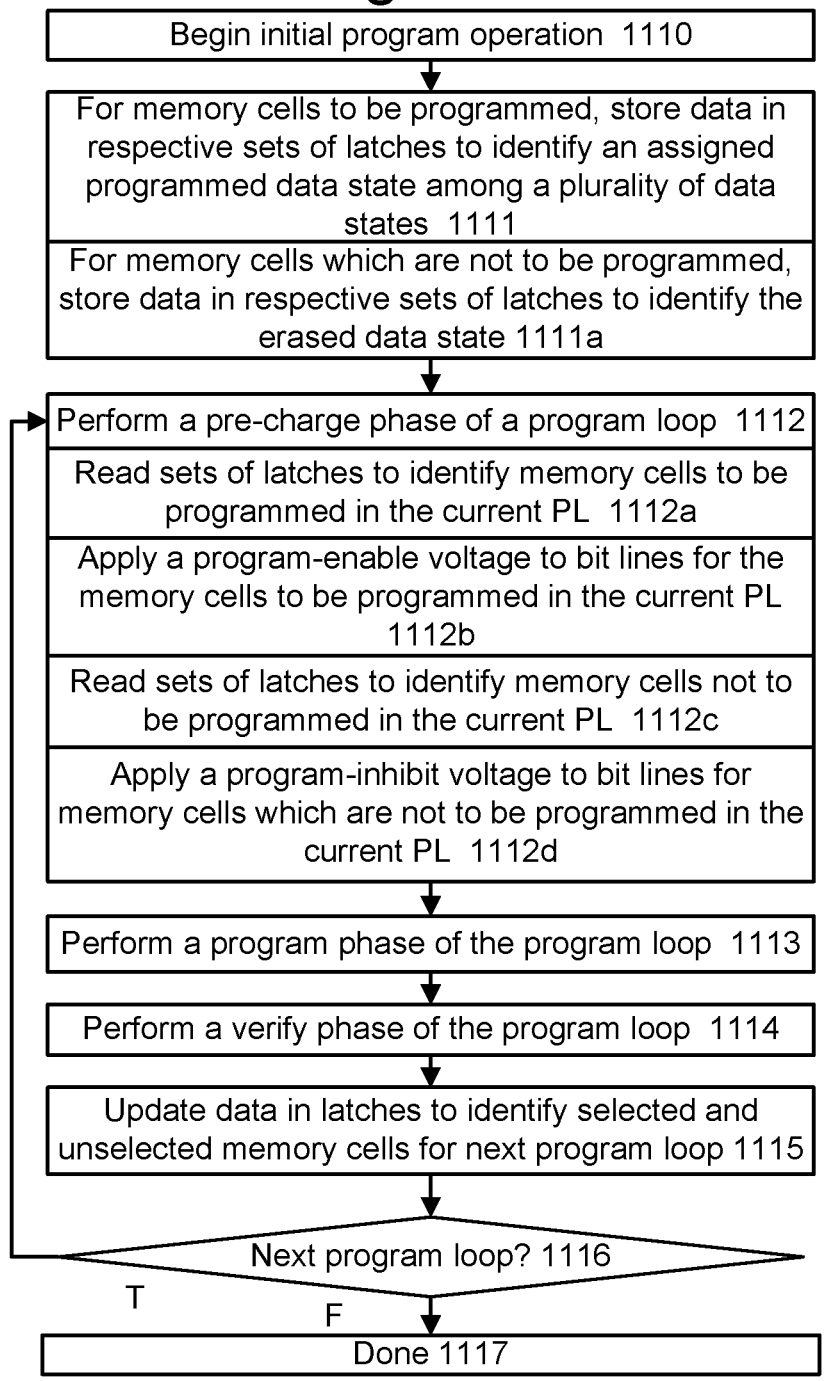

Fig. 11C
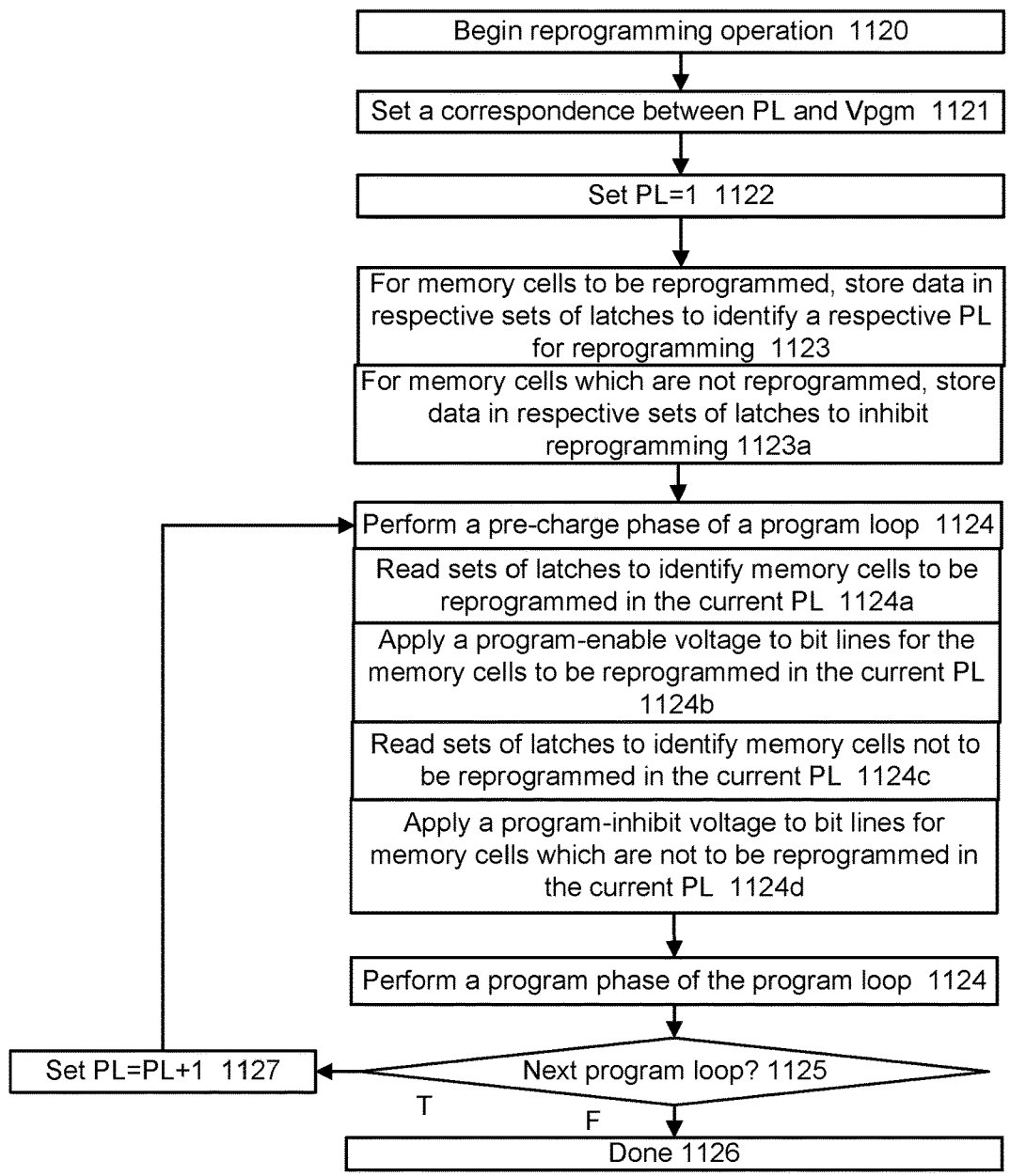
Fig. 11C1
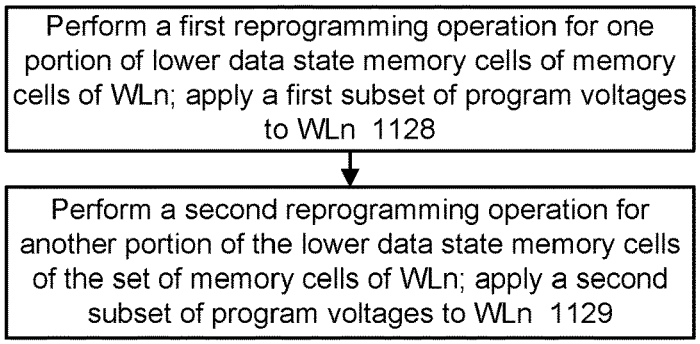

Fig. 12A

WLn: Er | WLn+1: Er | A | B | C | D | E | F | G
---|---|---|---|---|---|---|---|---
Er | n.a. | n.a | n.a. | n.a. | n.a. | n.a. | n.a. | n.a
A | 16 | 16 | 16 | 16 | 16 | 16 | n.a. | n.a.
B | 17 | 17 | 17 | 17 | 17 | 17 | n.a. | n.a.
C | 18 | 18 | 18 | 18 | 18 | 18 | n.a. | n.a.
D | 19 | 19 | 19 | 19 | 19 | 19 | n.a. | n.a.
E | 20 | 20 | 20 | 20 | 20 | 20 | n.a. | n.a.
F | n.a. | n.a | n.a. | n.a. | n.a. | n.a. | n.a. | n.a
G | n.a. | n.a | n.a. | n.a. | n.a. | n.a. | n.a. | n.a

Fig. 12B

WLn: Er | WLn+1: Er | A | B | C | D | E | F | G
---|---|---|---|---|---|---|---|---
Er | n.a. | n.a | n.a. | n.a. | n.a. | n.a. | n.a. | n.a.
A | 16 | 15.75 | 15.50 | 15.25 | 15 | 14.75 | n.a. | n.a.
B | 17 | 16.75 | 16.50 | 16.25 | 16 | 15.75 | n.a. | n.a.
C | 18 | 17.75 | 17.50 | 17.25 | 17 | 16.75 | n.a. | n.a.
D | 19 | 18.75 | 18.50 | 18.25 | 18 | 17.75 | n.a. | n.a.
E | 20 | 19.75 | 19.50 | 19.25 | 19 | 18.75 | n.a. | n.a.
F | n.a. | n.a | n.a. | n.a. | n.a. | n.a. | n.a. | n.a.
G | n.a. | n.a | n.a. | n.a. | n.a. | n.a. | n.a. | n.a.

Fig. 12B1

WLn: Er | WLn+1: Er | A | B | C | D | E | F | G
---|---|---|---|---|---|---|---|---
Er | n.a. | n.a | n.a. | n.a. | n.a. | n.a. | n.a. | n.a
A | 16 | 15.75 | 15.50 | 15.25 | 15 | 14.75 | n.a. | n.a.
B | 17 | 16.75 | 16.50 | 16.25 | 16 | 15.75 | n.a. | n.a.
C | 18 | 17.75 | 17.50 | 17.25 | 17 | 16.75 | n.a. | n.a.
D | 19 | 18.75 | 18.50 | 18.25 | 18 | 17.75 | n.a. | n.a.
E | 20 | 19.75 | 19.50 | 19.25 | 19 | 18.75 | n.a. | n.a.
F | n.a. | n.a | n.a. | n.a. | n.a. | n.a. | n.a. | n.a
G | n.a. | n.a | n.a. | n.a. | n.a. | n.a. | n.a. | n.a

Fig. 12B2

WLn: Er | WLn+1: Er | A | B | C | D | E | F | G
---|---|---|---|---|---|---|---|---
Er | n.a. | n.a. | n.a. | n.a. | n.a. | n.a. | n.a. | n.a.
A | 16 | 15.75 | 15.50 | 15.25 | 15 | 14.75 | n.a. | n.a.
B | 17 | 16.75 | 16.50 | 16.25 | 16 | 15.75 | n.a. | n.a.
C | 18 | 17.75 | 17.50 | 17.25 | 17 | 16.75 | n.a. | n.a.
D | 19 | 18.75 | 18.50 | 18.25 | 18 | 17.75 | n.a. | n.a.
E | 20 | 19.75 | 19.50 | 19.25 | 19 | 18.75 | n.a. | n.a.
F | n.a. | n.a. | n.a. | n.a. | n.a. | n.a. | n.a. | n.a.
G | n.a. | n.a. | n.a. | n.a. | n.a. | n.a. | n.a. | n.a.

Fig. 12C

| WLn \ WLn+1 | Er | A | B | C | D | E | F | G |
|---|---|---|---|---|---|---|---|---|
| Er | n.a. | n.a. | n.a. | n.a. | n.a. | n.a. | n.a. | n.a. |
| A | n.a. | 15.75 | 15.75 | 15.75 | 15 | 15 | n.a. | n.a. |
| B | 16.75 | 16.75 | 16.75 | 16.75 | 16 | 16 | n.a. | n.a. |
| C | 17.75 | 17.75 | 17.75 | 17.75 | 17 | 17 | n.a. | n.a. |
| D | 18.75 | 18.75 | 18.75 | 18.75 | 18 | 18 | n.a. | n.a. |
| E | 19.75 | 19.75 | 19.75 | 19.75 | 19 | 19 | n.a. | n.a. |
| F | n.a. | n.a. | n.a. | n.a. | n.a. | n.a. | n.a. | n.a. |
| G | n.a. | n.a. | n.a. | n.a. | n.a. | n.a. | n.a. | n.a. |

Fig. 12D

| WLn \ WLn+1 | Er | A | B | C | D | E | F | G |
|---|---|---|---|---|---|---|---|---|
| Er | n.a. | n.a. | n.a. | n.a. | n.a. | n.a. | n.a. | n.a. |
| A | n.a. | 16.5 | 16.5 | 16.5 | 16.5 | 16.5 | n.a. | n.a. |
| B | 16.5 | 16.5 | 16.5 | 16.5 | 16.5 | 16.5 | n.a. | n.a. |
| C | 19 | 19 | 19 | 19 | 19 | 19 | n.a. | n.a. |
| D | 19 | 19 | 19 | 19 | 19 | 19 | n.a. | n.a. |
| E | 19 | 19 | 19 | 19 | 19 | 19 | n.a. | n.a. |
| F | n.a. | n.a. | n.a. | n.a. | n.a. | n.a. | n.a. | n.a. |
| G | n.a. | n.a. | n.a. | n.a. | n.a. | n.a. | n.a. | n.a. |

Fig. 12E

| WLn \ WLn+1 | Er | A | B | C | D | E | F | G |
|---|---|---|---|---|---|---|---|---|
| Er | n.a. | 15.87 | 15.37 | 15.37 | 14.87 | 14.87 | n.a. | n.a. |
| A | 15.87 | 15.87 | 16.37 | 16.37 | 15.87 | 15.87 | n.a. | n.a. |
| B | 16.87 | 16.87 | 17.37 | 17.37 | 16.87 | 16.87 | n.a. | n.a. |
| C | 17.87 | 17.87 | 18.37 | 18.37 | 17.87 | 17.87 | n.a. | n.a. |
| D | 18.87 | 18.87 | 19.37 | 19.37 | 18.87 | 18.87 | n.a. | n.a. |
| E | 19.87 | 19.87 | n.a. | n.a. | n.a. | n.a. | n.a. | n.a. |
| F | n.a. | n.a. | n.a. | n.a. | n.a. | n.a. | n.a. | n.a. |
| G | n.a. | n.a. | n.a. | n.a. | n.a. | n.a. | n.a. | n.a. |

Fig. 12F

| WLn \ WLn+1 | Er | A | B | C | D | E | F | G |
|---|---|---|---|---|---|---|---|---|
| Er | n.a. | 16.75 | 16.75 | 16.75 | 16 | 16 | n.a. | n.a. |
| A | 16.75 | 16.75 | 16.75 | 16.75 | 16 | 16 | n.a. | n.a. |
| B | 16.75 | 16.75 | 16.75 | 16.75 | 16 | 16 | n.a. | n.a. |
| C | 16.75 | 16.75 | 16.75 | 16.75 | 16 | 16 | n.a. | n.a. |
| D | 19.25 | 19.25 | 19.25 | 19.25 | 18.5 | 18.5 | n.a. | n.a. |
| E | 19.25 | 19.25 | 19.25 | 19.25 | 18.5 | 18.5 | n.a. | n.a. |
| F | n.a. | n.a. | n.a. | n.a. | n.a. | n.a. | n.a. | n.a. |
| G | n.a. | n.a. | n.a. | n.a. | n.a. | n.a. | n.a. | n.a. |

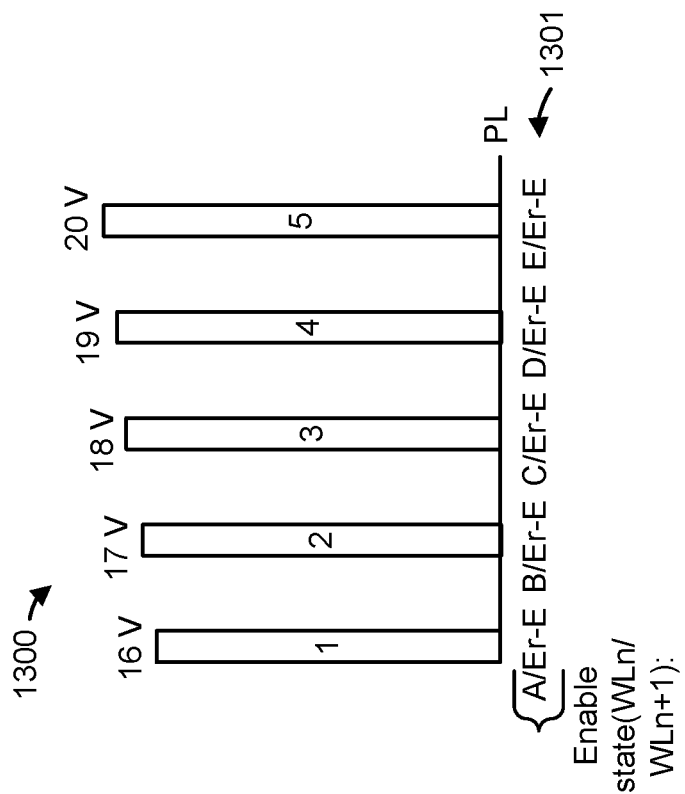

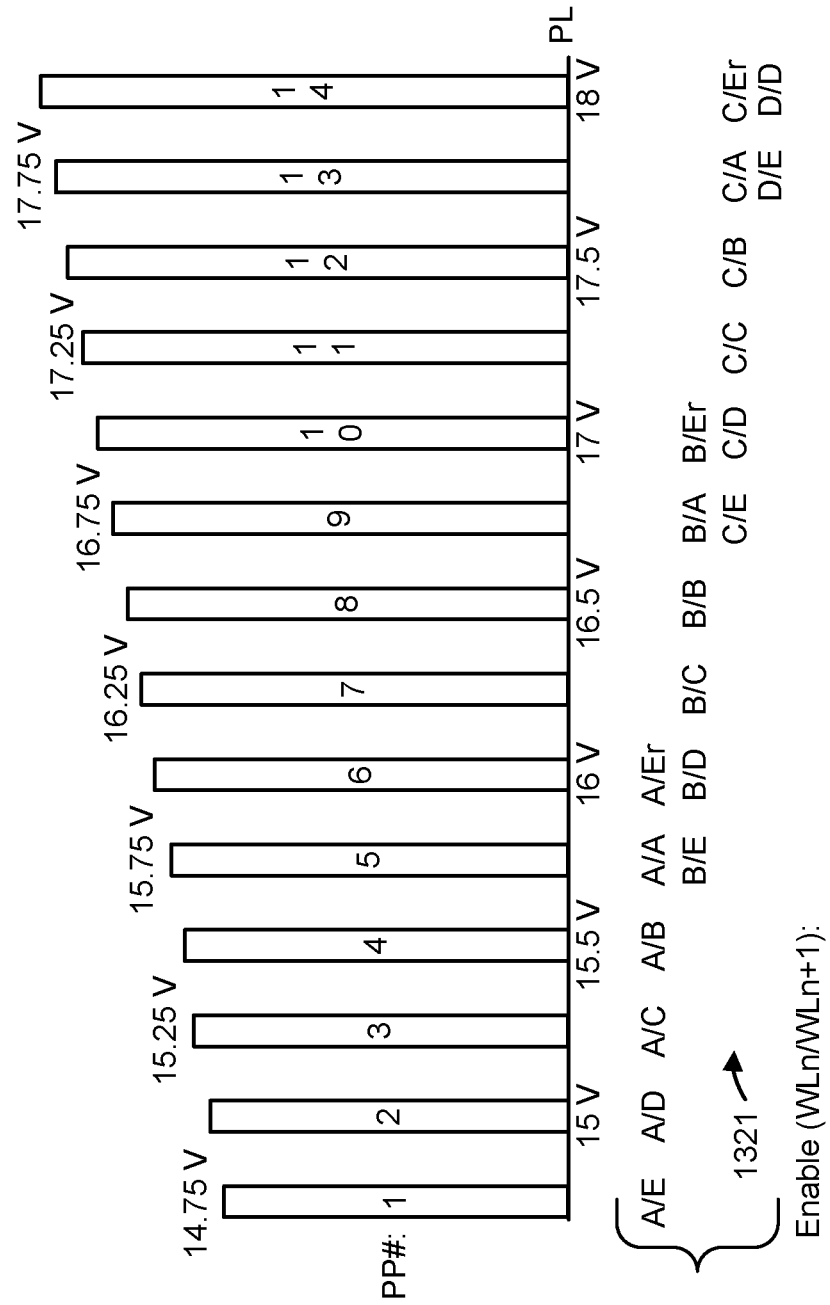
Fig. 13B1

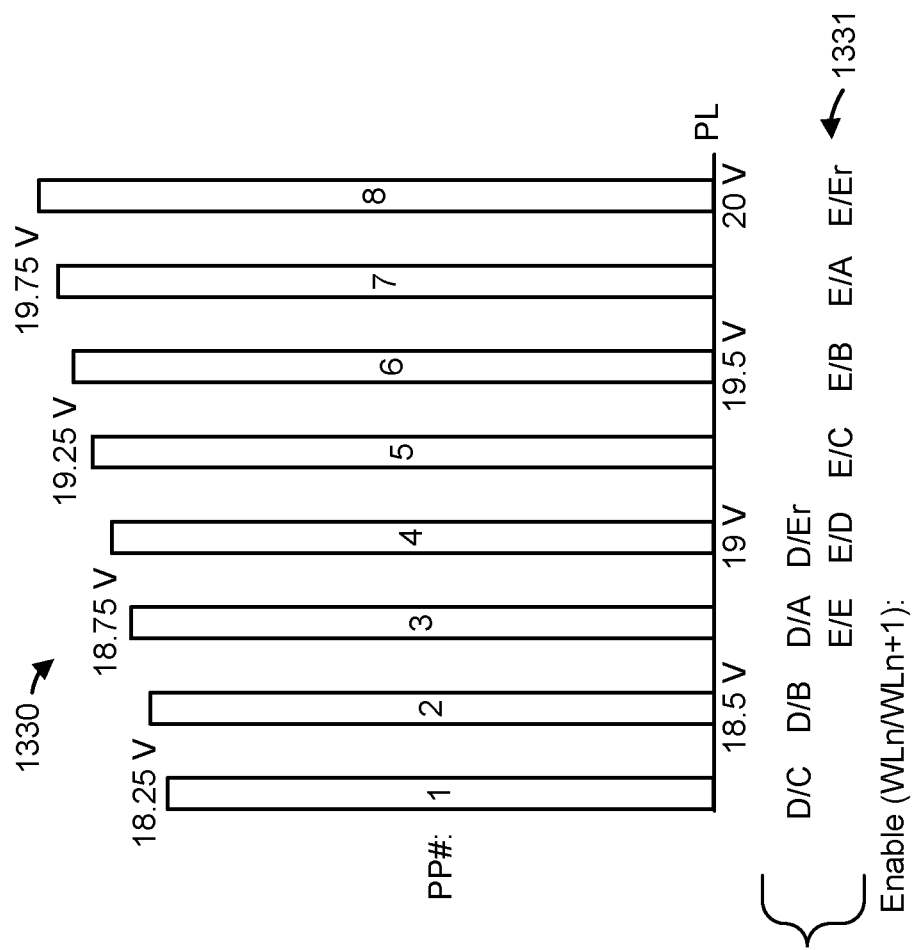
Fig. 13B2

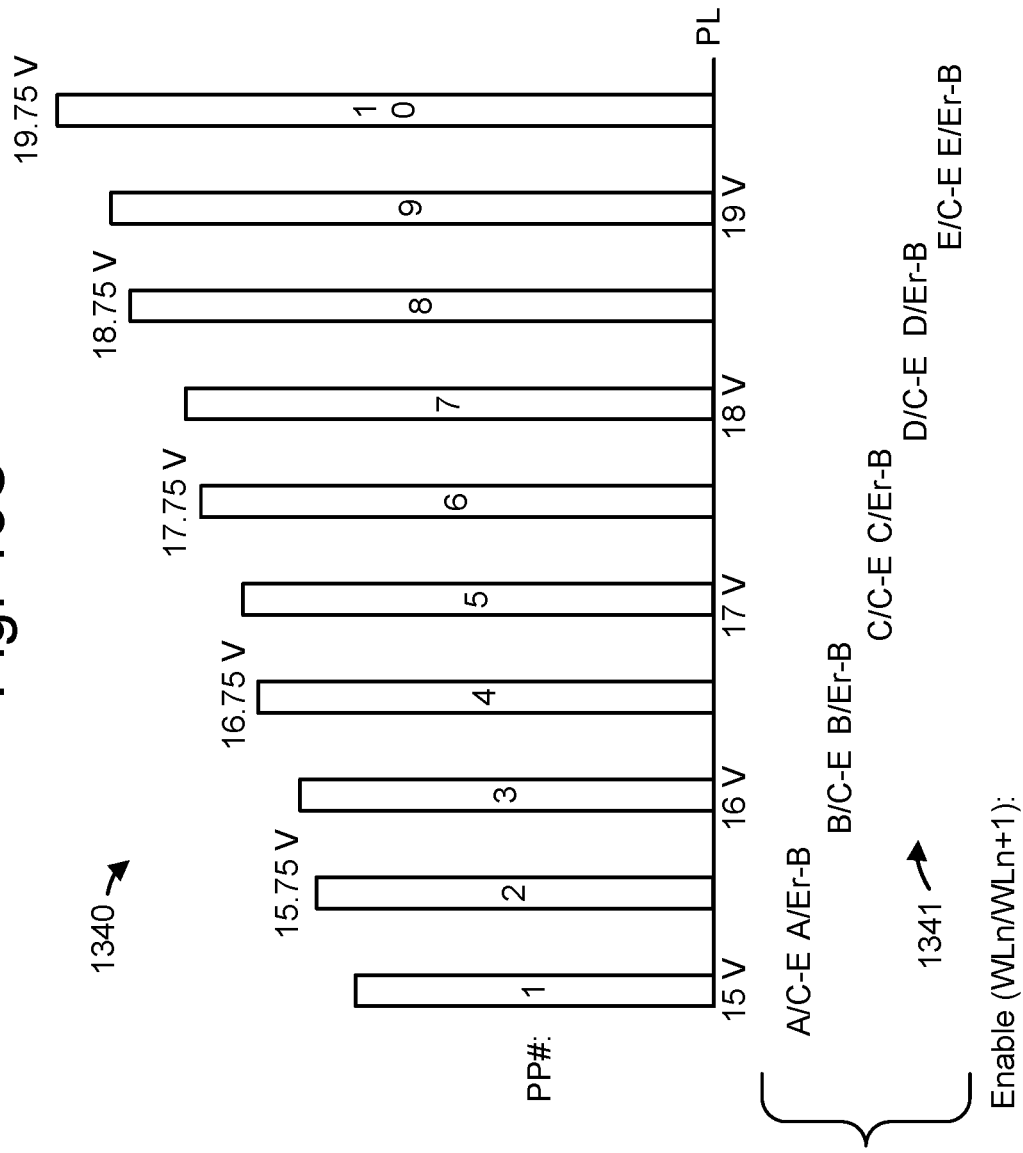

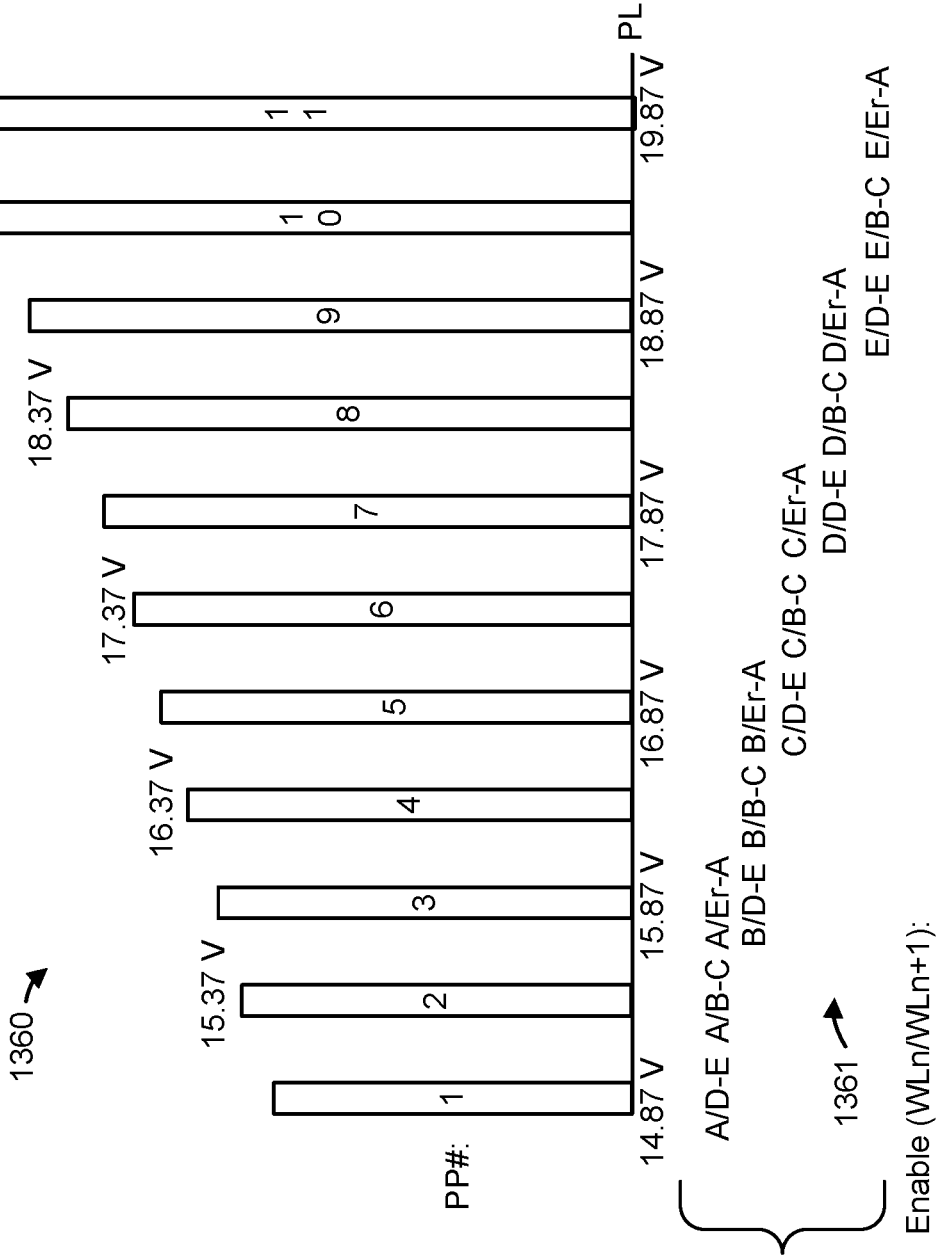

REPROGRAMMING MEMORY CELLS TO TIGHTEN THRESHOLD VOLTAGE DISTRIBUTIONS AND IMPROVE DATA RETENTION

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1B depicts an example of the temperature-sensing circuit 116 of FIG. 1A.

FIG. 2 is a block diagram depicting one embodiment of the sense block 51 of FIG. 1A.

FIG. 6B depicts a close-up view of the region 622 of the stack of FIG. 6A.

FIG. 7A depicts an example view of NAND strings in a block BLK0 which is consistent with FIGS. 4 and 6A.

FIG. 8A depicts example Vth distributions of a set of memory cells connected to WLn after an initial programming.

FIG. 8B depicts example Vth distributions of the set of memory cells connected to WLn after programming a set of memory cells connected to WLn+1.

FIG. 8C depicts example Vth distributions of the set of memory cells connected to WLn after a reprogramming.

FIG. 9A depicts an example voltage signal used in an initial program operation, consistent with FIG. 8A, and FIG. 11A at step 1100 and 1101.

FIG. 9B depicts an example of verify voltages used in the different program loops of FIG. 9A.

FIG. 11A depicts a process for programming and reprogramming sets of memory cells to tighten Vth distributions and improve data retention.

FIG. 11B depicts a process for programming a set of memory cells in an initial program operation, consistent with step 1100 or 1101 of FIG. 11A.

FIG. 11C depicts a process for reprogramming a set of memory cells, consistent with step 1104 of FIG. 11A.

FIG. 11C1 depicts a process for reprogramming a set of memory cells in multiple operations, consistent with step 1104 of FIG. 11A.

FIG. 12A depicts a first example table of program pulse magnitudes for reprogramming, consistent with FIG. 11A, where the program pulse magnitudes for the data states Er-E of WLn+1 are grouped.

FIG. 12B depicts a second example table of program pulse magnitudes for reprogramming, consistent with FIG. 11A, where the program pulse magnitudes for the A-E state memory cells of WLn vary as the data states of the memory cells of WLn+1 vary between Er-E.

FIG. 12B1 depicts a third example table of program pulse magnitudes comprising a first subset of the program pulse magnitudes of FIG. 12B, ranging from 14.75-18 V, for use in the first reprogramming operation of FIG. 11C1, step 1128.

FIG. 12B2 depicts a fourth example table of program pulse magnitudes comprising a second subset of the program pulse magnitudes of FIG. 12B, ranging from 18.25-20 V, for use in the second reprogramming operation of FIG. 11C1, step 1129.

FIG. 12C depicts a fifth example table of program pulse magnitudes for reprogramming, consistent with FIG. 11A, where the program pulse magnitudes for the data states Er-B and C-E of WLn+1 form first and second groups, respectively.

FIG. 12D depicts a sixth example table of program pulse magnitudes for reprogramming, consistent with FIG. 11A, where the program pulse magnitudes for the data states A and B of WLn and Er-E of WLn+1 form a first group, and the program pulse magnitudes for the data states C-E of WLn and Er-E of WLn+1 form a second group.

FIG. 12E depicts a seventh example table of program pulse magnitudes for reprogramming, consistent with FIG. 11A, where the program pulse magnitudes for the data states Er and A, B and C, and D and E of WLn+1 form first, second and third groups, respectively.

FIG. 12F depicts an eighth example table of program pulse magnitudes for reprogramming, consistent with FIG. 11A, where the program pulse magnitudes for the data states A-C of WLn and Er-B of WLn+1, A-C of WLn and C-E of WLn+1, D and E of WLn and Er-B of WLn+1, and D and E of WLn and C-E of WLn+1 form first, second, third and fourth groups, respectively.

FIG. 13A depicts a plot of program pulses for a reprogramming operation, and an indication of combinations of data states of WLn memory cells and adjacent WLn+1 memory cells which are enabled for each program pulse, consistent with FIG. 12A.

FIG. 13B1 depicts a plot of program pulses for a reprogramming operation, and an indication of combinations of data states of WLn memory cells and adjacent WLn+1 memory cells which are enabled for each program pulse, consistent with FIG. 12B1.

FIG. 13B2 depicts a plot of program pulses for a reprogramming operation, and an indication of combinations of data states of WLn memory cells and adjacent WLn+1 memory cells which are enabled for each program pulse, consistent with FIG. 12B2.

FIG. 13C depicts a plot of program pulses for a reprogramming operation, and an indication of combinations of data states of WLn memory cells and adjacent WLn+1 memory cells which are enabled for each program pulse, consistent with FIG. 12C.

FIG. 13E depicts a plot of program pulses for a reprogramming operation, and an indication of combinations of data states of WLn memory cells and adjacent WLn+1 memory cells which are enabled for each program pulse, consistent with FIG. 12E.

DETAILED DESCRIPTION

Figure 1A:
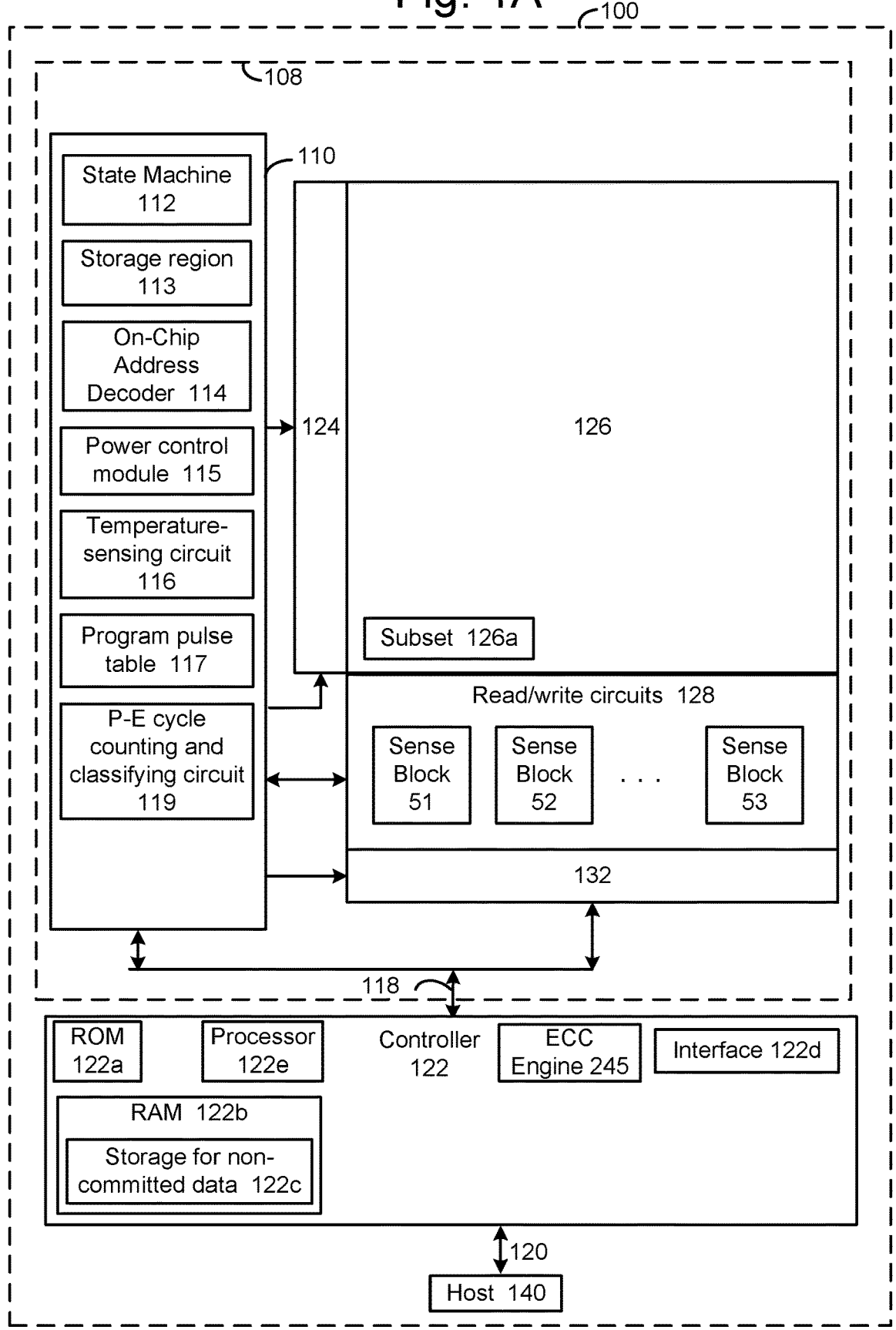
FIG. 1A is a block diagram of an example memory device.

Apparatuses and techniques are described for reprogramming memory cells to tighten threshold voltage distributions and improve data retention. The reprogramming can occur after an initial program operation.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

After a block of memory cells is erased in an erase operation, programming can occur in which the memory cells are programmed according to a word line programming order. For example, the programming may start at the word line at the source-side of the block and proceed to the word line at the drain-side of the block, one word line at a time. A word line can also be programmed in a sub-block programming order, extending from SB0 to SB3, for example, when there are four sub-blocks (FIG. 7A). For example, a portion of the memory cells of WLn in SB0 are first programmed, followed by a portion of the memory cells of WLn in SB1, a portion of the memory cells of WLn in SB2 and then a portion of the memory cells of WLn in SB3. WLn refers to a word line selected for programming A programming operation may include one or more sets of increasing program voltages or pulses which are applied to a word line in respective program loops, also referred to as program-verify iterations, such as depicted in FIG. 9A. Verify tests may be performed after each program voltage to determine whether the memory cells have completed programming. The programming is complete when the memory cells are in an assigned data state as represented by a threshold voltage (Vth) distribution, such as in FIG. 8A.

However, the programming of the memory cells of an (n+1)st word line, e.g., WLn+1, tends to change the Vth of the memory cells of the previously-programmed adjacent nth word line, WLn. In particular, neighbor word line interference (NWI) involves capacitive coupling between adjacent memory cells in a NAND string, where a later-programmed memory cell can increase the Vth of the adjacent earlier-programmed memory cell. NWI is expected to worsen in future 3D memory device when the distance between adjacent memory cell in a NAND string decreases. Data retention loss and lateral movement of charges between the adjacent memory cells can also change the Vth of the memory cells from the intended level. Data retention loss is worse at higher temperatures.

The above issues can be addressed in part by using a fine-grained programming process, such as a process involving multiple program passes, to provide a narrow Vth distribution for the data states. However, this takes additional times and does not compensate for the effects of the programming of an adjacent word line or adequately address the issue of data retention loss.

Techniques provided herein address the above and other issues. In one aspect, the memory cells of a word line WLn are reprogrammed after the programming of the memory cells of an adjacent, later-programmed word line WLn+1. In one approach, the reprogramming is limited to lower state memory cells of WLn which are adjacent to lower state memory cells of WLn+1. This helps avoid the effects of program disturb because it avoids the use of a relatively high program pulse to program higher state memory cells. Further, a program pulse magnitude used in the reprogramming can be tailored to the data state of the WLn memory cell and the adjacent, same-NAND string WLn+1 memory cell. For example, see the tables of FIGS. 12A-12F. As shown in FIG. 12B, for example, the program pulse magnitude can be relatively high when the state of the WLn memory cell is relatively high and/or the state of the WLn+1 memory cell is relatively low.

In some cases, the program pulse magnitudes can be grouped to reduce the implementation complexity and time, such as in FIGS. 12A and 12C-12F. In some cases, the reprogramming can occur in multiple reprogramming operations, such as in FIG. 12B1 and 12B2. In some cases, a memory cell is reprogrammed by applying a plurality of program pulses to the respective word line and controlling a respective bit line voltage to enable programming during a single program pulse of the plurality of program pulses, such as depicted in FIGS. 13A-13F. The respective bit line voltage is controlled to inhibit programming of the memory cell during remaining program pulses of the plurality of program pulses. The reprogramming can also occur without performing a verify test to save time. The reprogramming of a single memory cell can therefore involve a single program pulse without a verify test to save time.

The reprogramming can occur relatively soon after an initial program operation has completed, during an idle time of a control circuit, so that the reprogramming does not delay other higher-priority tasks by the control circuit. For example, an entire block of memory cells may be programmed, after which the reprogramming of each word line occurs. In another approach, a portion of a block may be programmed, after which the reprogramming of each programmed word line occurs. The reprogramming of different word lines can alternate with other tasks of a control circuit.

The reprogramming can tighten Vth distributions and improve data retention.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116, a program pulse table 117, and a P-E cycle counting and classifying circuit 119. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device on during the lifetime of the memory device, e.g., every minute. The program pulse magnitudes in the program pulse table 117 can be adjusted based on the temperature. For example, as the temperature increases, the program pulse magnitudes can be decreased, since the memory cells become easier to program.

The program pulse table 117 can indicate a program pulse magnitude for reprogramming as discussed herein. See FIG. 12A-12F for examples. The program pulse table 117 can also indicate a correspondence between program pulse magnitude and program pulse number. See FIG. 13A-13F for examples.

The P-E cycle counting and classifying circuit 119 can track the number of program-erase (P-E) cycles of a block and classify the block into a category based on the number of P-E cycles. For example, first, second and third categories can represent a relatively low, intermediate or relatively high number of P-E cycles. The first, second and third categories can represent the beginning, middle and end of life, respectively, of a block. Also, the blocks can be periodically reclassified, and the number of blocks per group can change over time. The program pulse magnitudes in the program pulse table 117 for a block can be adjusted based on the P-E classification. For example, as the number of P-E cycles increases, the program pulse magnitudes can be decreased, since the memory cells become easier to program.

See FIG. 1B for an example implementation of the temperature-sensing circuit. The circuits 116 and 119, and the table 117, may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, program pulse table 117, P-E cycle counting and classifying circuit 119, fail bit determination circuit 127, sense blocks 51, 52, . . . , 53, read/write circuits 128, controller 122, and so forth.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122*c* may store one or more word lines of data.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The memory in the controller 122, such as such as ROM 122*a* and RAM 122*b*, comprises code such as a set of instructions, and the processor is operable to execute the set of instructions to provide the functionality described herein. Alternatively or additionally, the processor can access code from a subset 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*e* fetches the boot code from the ROM 122*a* or the subset 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122*b* and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. See also Vbl in FIG. 10. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the transistor 55 to provide Vbl_sense, e.g., 0.5 V, on the bit line. A Vbl selector 173 may pass a relatively high voltage such as Vdd to the drain 57, which is higher than the control gate voltage on the transistor 55, to provide the source-follower mode during sensing operations.

The Vbl selector 173 can pass one or f a number of voltage signals. For example, the Vbl selector can pass a program-inhibit voltage signal which increases from an initial voltage, e.g., 0 V, to a program inhibit voltage, e.g., Vbl_unsel (also referred to as Vbl_inh) for respective bit lines of unselected NAND string during a program loop. The Vbl selector 173 can pass a program-enable voltage signal such as 0 V for respective bit lines of selected NAND strings during a program loop. The Vbl selector may receive voltage signals from the first, second and third voltage sources 440a-440c, respectively, in FIG. 3, and select one of these signals based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
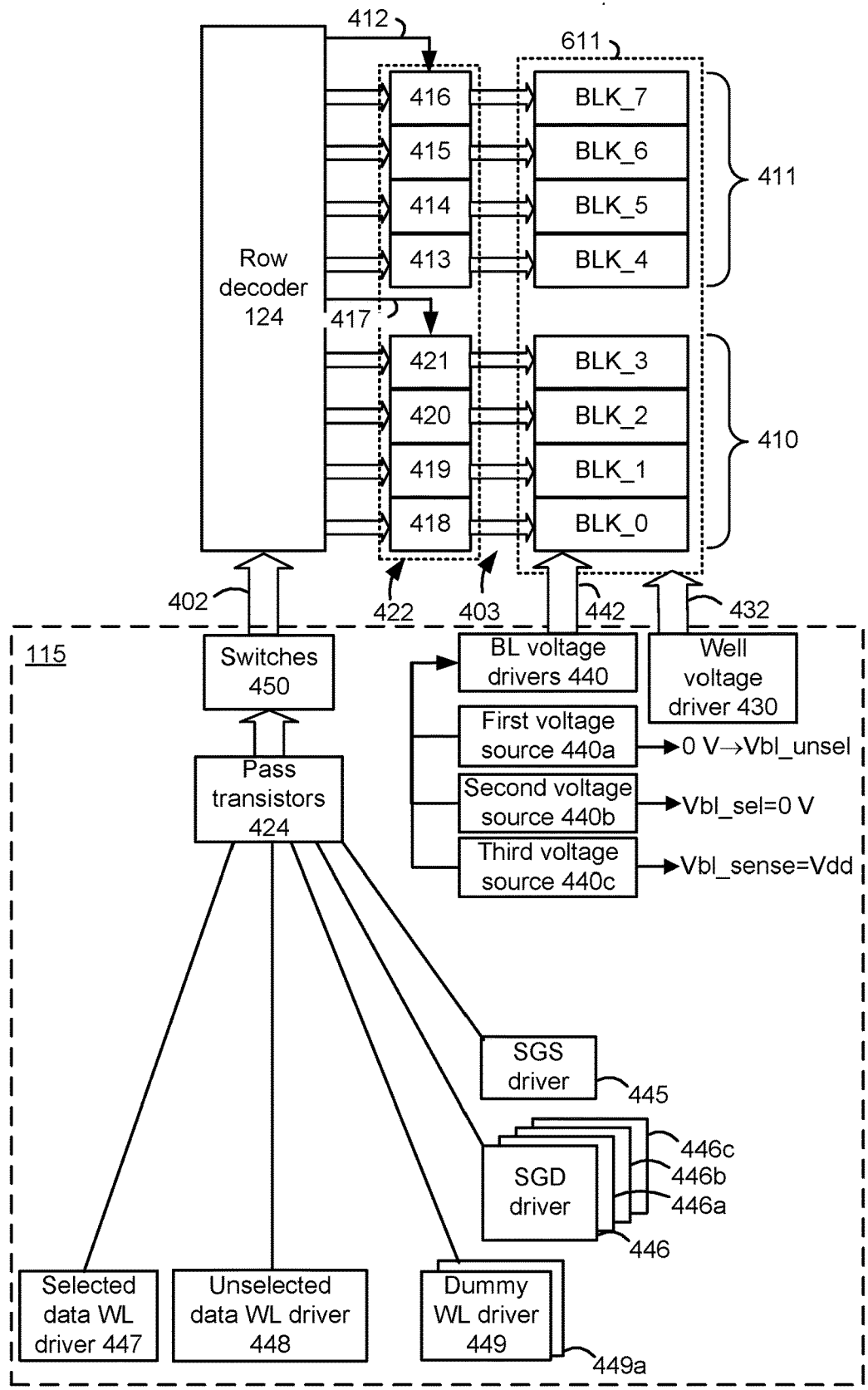
FIG. 3 depicts an example implementation of the power control circuit 115 of FIG. 1A for providing voltages to blocks of memory cells.

FIG. 3 depicts an example implementation of the power control circuit 115 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected sub-block at a time in a block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The driver 447 can provide a pre-charge voltage and a program voltage on WLn during a program loop of a program operation. A driver 448 can be used for unselected data word lines, and dummy word line drivers 449 and 449a can be used to provide voltages on dummy word lines WLDD and WLDS, respectively, in FIG. 6A. For example, the driver 448 can be used to apply a pre-charge voltage and a pass voltage on the unselected word lines during a program loop of a program operation. See also VWL_unsel in FIG. 10.

The voltage drivers can also include separate SGD drivers for each sub-block. For example, SGD drivers 446, 446a, 446b and 446c can be provided for SB0, SB1, SB2 and SB3, respectively, such as in FIG. 7A. In one option, an SGS driver 445 is common to the different sub-blocks in a block.

The various components, including the row decoder, may receive commands from a controller such as the state machine 112 or the controller 122 to perform the functions described herein.

The well voltage driver 430 provides a voltage Vsl to the well region 611b (FIG. 6A) in the substrate, via control lines 432. The well voltage driver 430 is one example of a source line driver, where the well region 611b is a source line, e.g., a conductive path connected to the source ends of the NAND strings. In one approach, the well region 611a is common to the blocks. A set of bit lines 442 is also shared by the blocks.

Bit line voltage drivers 440 include voltage sources which provide voltages to the bit lines. For example, the bit line voltage drivers can include a first voltage source 440a which is configured to output a program-inhibit voltage signal. This signal increases from an initial level such as 0 V to a final, peak level such as Vbl_unsel, to pre-charge a channel of a respective NAND string and prevent programming of memory cells in the NAND string.

The bit line voltage drivers can also include a second voltage source 440b which is configured to output a program-enable voltage signal. This signal can have a fixed voltage such as 0 V which allows programming to occur for a selected memory cell in a respective NAND string. The bit line voltage drivers can also include a third voltage source 440c which is configured to output a fixed voltage, Vbl_sense, which allows sensing to occur for a selected memory cell in the respective NAND string. The sensing can occur during a read or a verify test. The voltage sources 440a, 440b and 440c may be connected to the sense circuits and used to provide voltages to the Vbl selector 173 of FIG. 2, for example.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
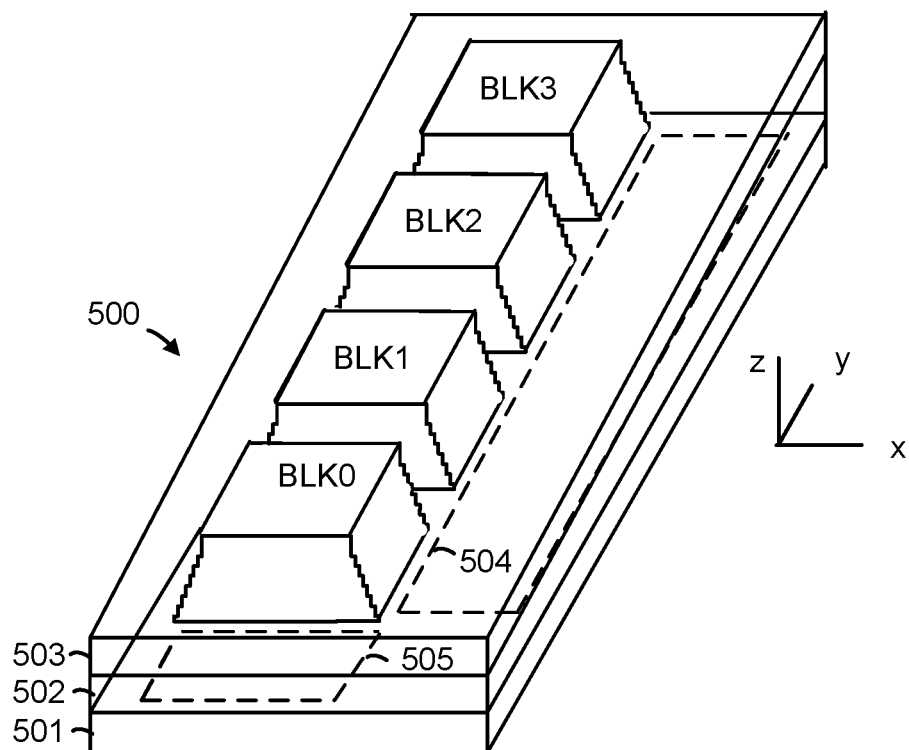
FIG. 4 is a perspective view of a memory device 500 comprising a set of blocks in an example 3D configuration of the memory structure 126 of FIG. 1A.

FIG. 4 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
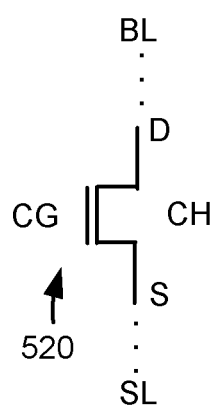
FIG. 5 depicts an example transistor 520 in the memory structure 126 of FIG. 1A.
Figure 6A:
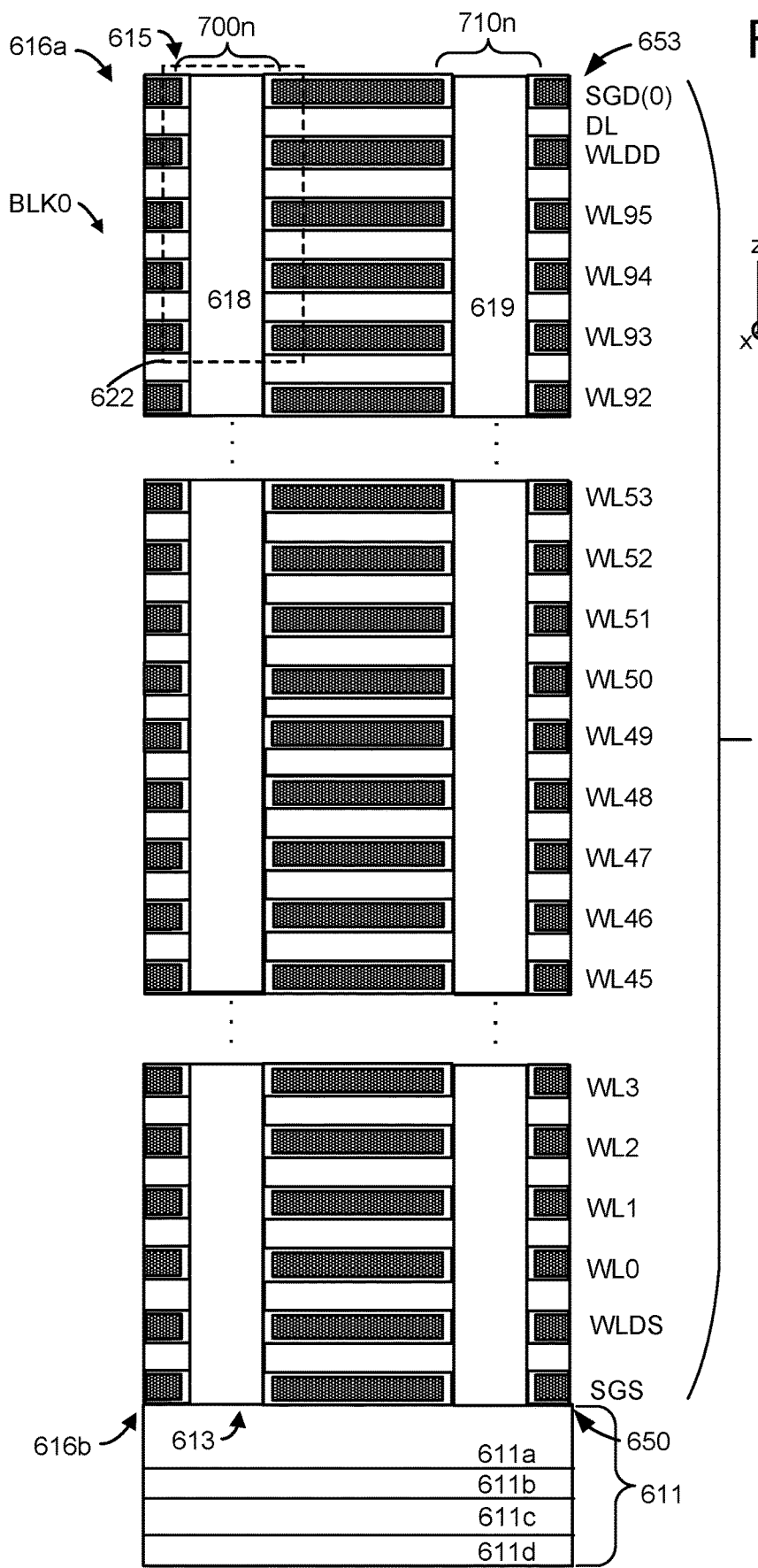
FIG. 6A depicts an example cross-sectional view of a portion of BLK0 of FIG. 4, including NAND strings 700n and 710n.

FIG. 5 depicts an example transistor 520 in the memory structure 126 of FIG. 1. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of BLK0 of FIG. 4, including NAND strings 700n and 710n. In this example, the NAND strings 700n and 710n are in different sub-blocks. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 611a (see also FIG. 3) is an n-type source diffusion layer or well in the substrate. The well region is in contact with a source end of each string of memory cells in a block. The n-type well region 611a in turn is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach, and form a source line SL which provides a voltage to a source end of each NAND string in a block.

The NAND string 700n has a source end 613 at a bottom 616b of the stack 610 and a drain end 615 at a top 616a of the stack. Metal-filled slits may be provided periodically across the stack as local interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride ($Si_3N_4$) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole.

In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

FIG. 7A depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 7B:
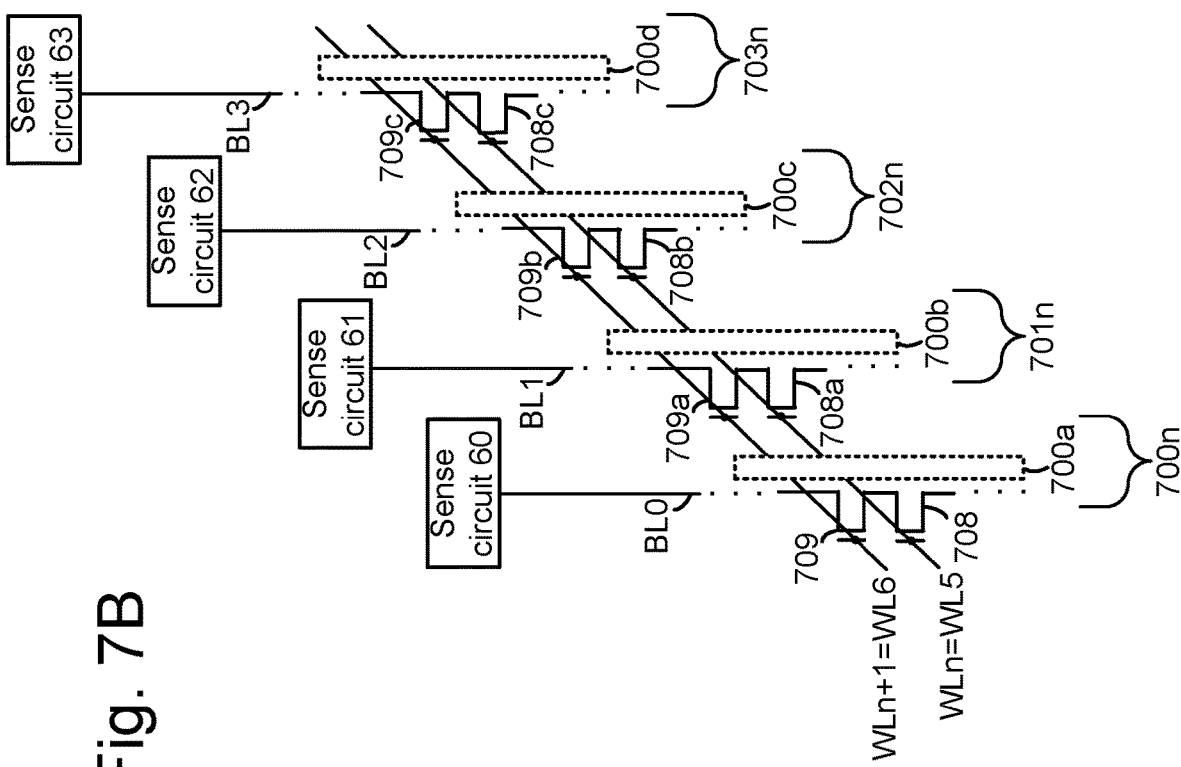
FIG. 7B depicts an example view of memory cells connected to WL5 and WL6 in the sub-block SB0 of FIG. 7A, with respective NAND strings, bit lines and sense circuits.

FIG. 7B depicts an example view of memory cells connected to WL5 and WL6 in the sub-block SB0 of FIG. 7A, with respective NAND strings, bit lines and sense circuits. The memory cells 708 and 709 and channel 700a of the NAND string 700n in SB0 of FIG. 7A are depicted, along with a respective bit line BL0. SB0 also includes NAND strings 701n, 702n and 703n which have channels 700b, 700c and 700d, respectively, and which are connected to bit lines BL1, BL2 and BL3, respectively. The bit lines BL0-BL3 are connected to the sense circuits 60-63, respectively, of FIG. 2.

The memory cells 708, 708a, 708b and 708c are connected to WL5, and the memory cells 709, 709a, 709b and 709c are connected to WL6, WL5 is an example of a word line WLn being reprogrammed, and WL6 is an example of an adjacent, later-programmed word line WLn+1. Further, in the NAND string 700n, the memory cell 708 is an example of a first memory cell being reprogrammed and the memory cell 709 is an example of an adjacent second memory cell. The memory cells 708 and 709 form a pair of adjacent memory cells in a NAND string. Similarly, memory cells 708a and 709a, 708b and 709b and 708c and 709c form three additional pairs of adjacent memory cells.

As discussed further below, a decision of whether to reprogram the memory cell 708 can be based on its data state as well as the data state of the memory cell 709. Further, if a reprogramming occurs, a program pulse magnitude in the reprogramming can be a function of the data state (or other range of threshold voltages) of the memory cell 708 and the memory cell 709.

The memory cells 708-708c can be programmed in the same reprogramming operation with the same or different program pulse magnitudes. For example, during a particular program pulse applied to WL5, the memory cell 708 could be enabled for programming while the memory cells 708a-708c are inhibited from programming.

FIG. 8A depicts example Vth distributions of a set of memory cells connected to WLn after an initial programming In FIG. 8A-8C, the common vertical axes depict a number of memory cells on a logarithmic scale, and the common horizontal axes depict a Vth of the memory cells on a linear scale. Also, the memory cells store three bits per cell so that there are eight data states.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states. In a four-bit per cell memory device, there are sixteen data states including the erased state S0 and fifteen programmed data states S1-S15. Each data state can be represented by a respective range of threshold voltages (Vth) in the memory cells. For example, an A state memory cell has a Vth in the range of VrA-VrB.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

In one approach, at a start of a program operation, the memory cells are all initially in the erased (Er) state, as represented by the Vth distribution 800. After the program operation is successfully completed, the memory cells assigned to the A-G states are represented by the Vth distributions 811-817, respectively. The Er state memory cells are represented by the Vth distribution 810, which is upshifted from the initial Vth distribution 800 due to program disturb.

The memory cells which are programmed to the A-G states use verify voltages (Vverify) of VvA-VvG, respectively. These Vth distributions are obtained just after completion of the program operation, and assume no neighbor word line interference or data retention loss has occurred. Read voltages VrA-VrG can be used for reading the states of the memory cells in a read operation.

In an erase operation, the memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines.

The Er-G states are examples of assigned data states, and the A-G states are examples of programmed data states, in this eight-state example.

FIG. 8B depicts example Vth distributions of the set of memory cells connected to WLn after programming a set of memory cells connected to WLn+1. A reprogramming has not yet occurred for WLn. As mentioned, the Vth of the WLn memory cells can be increased due to NWI, especially when the data state of the WLn+1 memory cell is significantly higher than the adjacent WLn memory cell. For example, the Vth increase is largest for an A state memory cell of WLn when the adjacent WLn+1 memory cell is in the G state. The Vth of the WLn memory cells is typically not increased due to NWI when the data state of the WLn+1 memory cell is low. For example, the Vth may be unaffected for an A state memory cell of WLn when the adjacent WLn+1 memory cell is in the Er state. An intermediate amount of Vth increase may be experienced for an A state memory cell of WLn when the adjacent WLn+1 memory cell is in an intermediate state such as the D state, or for a D state memory cell of WLn when the adjacent WLn+1 memory cell is in the G state.

Generally, the Vth increase due to NWI becomes smaller as the data state of the WLn memory cell increases. For example, the Vth increase for a D state memory cell of WLn will be smaller than the Vth increase for an A state memory cell of WLn, e.g., when the WLn+1 memory cell is in the G state.

In view of the above, the Vth distribution for a programmed data state will be made up of different component Vth distributions which represent different amounts of Vth increases due to NWI. For example, the Vth distribution 801 for the A state comprises the Vth distribution 811, which represents no upshift, such as for an A state WLn memory cell adjacent to an Er state WLn+1 memory cell, and the Vth distribution 821, which represents a significant upshift, such as for an A state WLn memory cell adjacent to a G state WLn+1 memory cell. Two component Vth distributions are depicted for simplicity. The Vth distribution 810 would also include other component Vth distributions for A state WLn memory cells adjacent to A-F state WLn+1 memory cells, for instance. The Vth distribution for a programmed data state is therefore widened and upshifted due to the changes in the component Vth distributions when WLn+1 is programmed.

Similarly, the Vth distribution 802 for the B state comprises the Vth distribution 812, which represents no upshift, such as for a B state WLn memory cell adjacent to an Er state WLn+1 memory cell, and the Vth distribution 822, which represents a significant upshift, such as for a B state WLn memory cell adjacent to a G state WLn+1 memory cell.

The Vth distribution 803 for the C state comprises the Vth distribution 813, which represents no upshift, such as for a C state WLn memory cell adjacent to an Er state WLn+1 memory cell, and the Vth distribution 823, which represents a significant upshift, such as for a C state WLn memory cell adjacent to a G state WLn+1 memory cell.

The Vth distribution 804 for the D state comprises the Vth distribution 814, which represents no upshift, such as for a D state WLn memory cell adjacent to an Er state WLn+1 memory cell, and the Vth distribution 824, which represents a significant upshift, such as for a D state WLn memory cell adjacent to a G state WLn+1 memory cell.

The Vth distribution 805 for the E state comprises the Vth distribution 815, which represents no upshift, such as for an E state WLn memory cell adjacent to an Er state WLn+1 memory cell, and the Vth distribution 825, which represents a significant upshift, such as for an E state WLn memory cell adjacent to a G state WLn+1 memory cell.

The Vth distribution 806 for the F state comprises the Vth distribution 816, which represents no upshift, such as for an F state WLn memory cell adjacent to an Er state WLn+1 memory cell, and the Vth distribution 826, which represents a small upshift, such as for an F state WLn memory cell adjacent to a G state WLn+1 memory cell. The F state memory cell is minimally affected by the data state of the adjacent WLn+1 memory cell.

The Vth distribution 807 for the F state essentially comprises the Vth distribution 817, which represents no significant upshift. The G state memory cell is minimally affected by the data state of the adjacent WLn+1 memory cell.

The programming of the WLn+1 memory cells widens and upshifts the Vth distributions of the WLn memory cells. This can result in read errors if the widening is too large, even if the read voltages VrA-VrG are adjusted.

The reprogramming techniques described herein can counteract the widening to tighten the Vth distributions. In one aspect, the techniques are based on classifying each WLn memory cell into a respective Vth range. For example, a Vth range 840 encompasses one subset of the data states, e.g., states Er-E, which can be considered to be lower data states among a plurality of data states Er-G. A Vth range 841 encompasses another subset of the data states, e.g., states F and G, which can be considered to be one or more higher data states among the plurality of data states. In one approach, a decision of whether to reprogram a WLn memory cell is based on whether the WLn memory cell and the adjacent WLn+1 memory cell are both classified among the lower data states.

FIG. 8C depicts example Vth distributions of the set of memory cells connected to WLn after a reprogramming. The reprogramming increases the Vth distributions 811-815 to become the narrowed Vth distributions 831-835, respectively, for the A-E states, respectively. The reprogramming thus increases the lower tail of the Vth distributions 801-805. The overall Vth distributions 801a-805a for the A-E states, respectively, are therefore narrower than the Vth distributions 801-805, respectively, of FIG. 8B. The F and G state memory cells of WLn are not reprogrammed in this example since their Vth is already relatively narrow. Also, a relatively large program pulse would be needed to increase the Vth of these higher state memory cells, potentially resulting in program disturb of the lower state memory cells of WLn.

FIG. 9A depicts an example voltage signal used in an initial program operation, consistent with FIG. 8A, and FIG. 11A at step 1100 and 1101. The voltage signal 900 includes a set of program pulses, including an initial program pulse 901, which are applied to a word line selected for programming. The initial program pulse has a voltage Vpgm_init, and dVpgm denotes the step size between successive program pulses. A single program pass is used having fifteen program loops, as an example. The verify signals in each program loop, including example verify signals 902, can encompass lower assigned data states, then midrange assigned data states and then higher assigned data states as the program operations proceeds, as depicted in FIG. 9B. See also the signals of FIG. 10 for example details of a program loop.

The example verify signals depict three verify voltages as a simplification. A verify signal is applied to a selected word line during a program loop after the application of a program pulse to the selected word line. Memory cells are sensed during the application of the verify signal in a verify test to judge their programming progress. A verify signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with two bits per cell, two pages of data can be stored in the memory cells connected to a word line. The data of the lower and upper pages can be determined by reading the memory cells using read voltages of VrA and VrC; and VrB, respectively.

With three bits per cell, three pages of data can be stored in the memory cells connected to a word line. The data of the lower, middle and upper pages can be determined by reading the memory cells using read voltages of VrA and VrE; VrB; and VrC and VrG, respectively.

FIG. 9B depicts an example of verify voltages used in the different program loops of FIG. 9A. The horizontal bars are time-aligned with the program loop axis of FIG. 9A. The bars overlap in some program loops, indicating that verify operations can be performed for multiple data states in the program loop. With eight data states, the bars indicate that verify voltages for the A, B, C, D, E, F and G states are applied in program loops 1-4, 3-6, 5-8, 7-10, 9-12, 11-14 and 12-15, respectively.

In one approach, the program loops in which the verify tests are performed are predetermined, before the program operation. In another approach, the program loops in which the verify tests are performed are determined adaptively as the programming progresses. For example, the B state verify tests may begin in a next program loop after a specified portion of the A state memory cells have passed their verify test.

Figure 10:
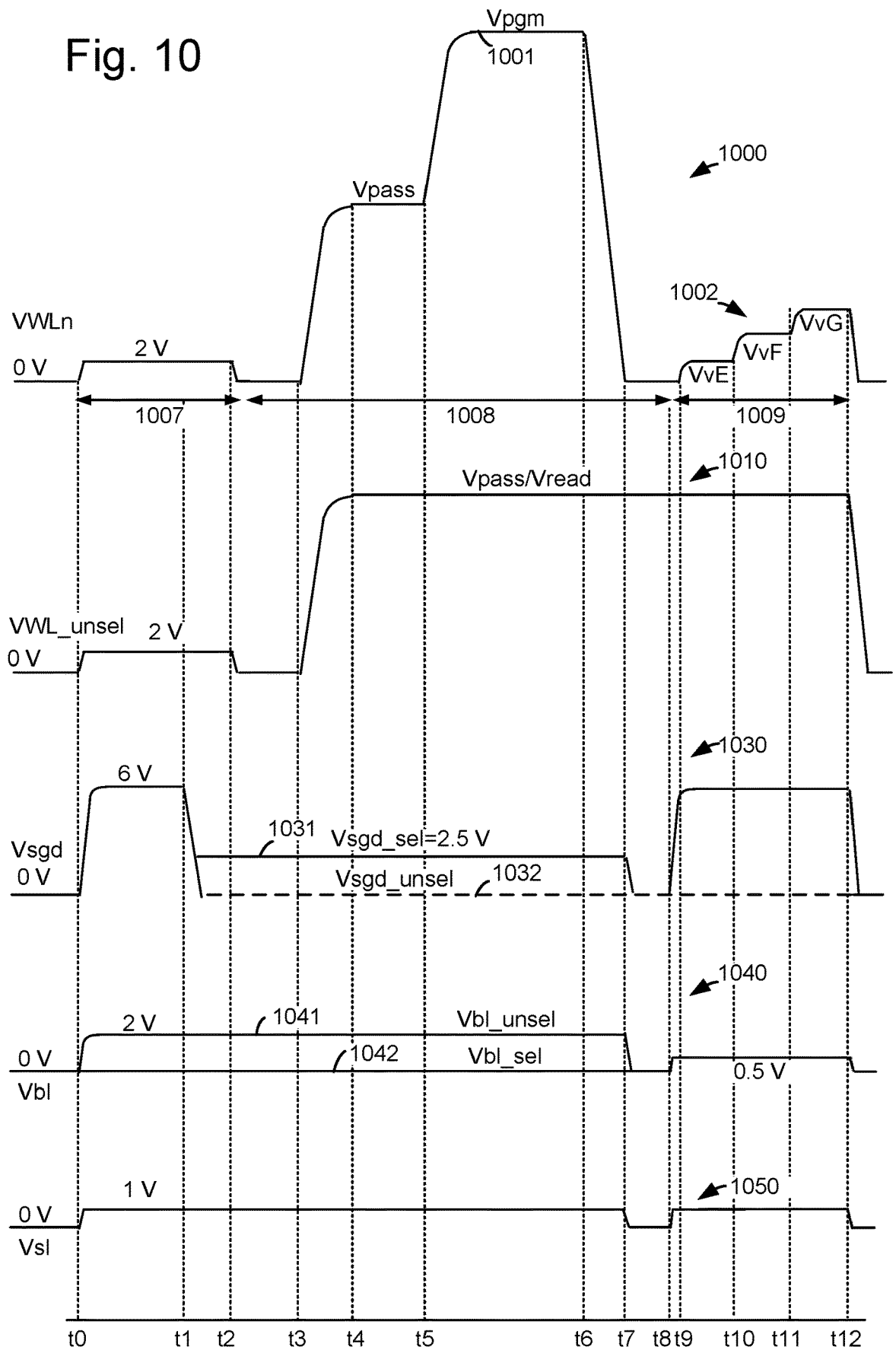
FIG. 10 depicts example voltage signals for performing an initial program operation, consistent with FIG. 9A.

FIG. 10 depicts example voltage signals for performing an initial program operation, consistent with FIG. 9A. The vertical dimension denotes voltage and the horizontal dimension denotes time, with time points t0-t12. The period of time depicted corresponds to one program loop and includes a pre-charge phase 1007 (t0-t2), a program phase 1008 (t2-t8) and a verify phase 1009 (t9-t12). Voltage signals 1000, 1010, 1030, 1040 and 1050 depict VWLn, VWL_unsel, Vsg, Vbl and Vsl, respectively.

In the pre-charge phase, VWLn and VWL_unsel can be set to a pre-charge voltage, e.g., 1-2 V.

For the bits lines of the unselected NAND strings, a program-inhibit voltage signal (plot 1041) is ramped up from 0 V to 2 V, for instance, at t0 to provide a small amount of channel boosting in the pre-charge phase and to inhibit programming in the program phase. For the bit lines of the selected NAND string, a fixed voltage such as 0 V (plot 1032) is applied to avoid channel boosting in the pre-charge phase and to allow programming to occur in the program phase. The program-enable voltage signal at 0 V is depicted by the plot 1042.

The SGD transistors of the selected and unselected sub-blocks are in a conductive state at this time, with a voltage of Vsg=6 V, for example. This allows the bit line voltage to be passed to the channel. The SGS transistors of the selected and unselected sub-blocks can also be in a conductive state at this time, with a voltage of 6 V, for example to allow Vsl=1 V to be passed to the source end of the channel.

Vsgd is set to 6 V to pass the bit line voltage to the drain ends of the NAND strings. In the program phase, VWLn and Vwl_unsel are ramped up, e.g., starting at t3, to provide a capacitive coupling up of the channels of the inhibited NAND strings. VWLn is then ramped up further at t5 to the peak program pulse level of Vpgm (plot 1001) and held at Vpgm until t4. After the application of the program pulse, the word line voltages are ramped down in a recovery process. During the program pulse, Vsgd for the selected sub-block, Vsgd_sel (plot 1031), is high enough to provide the selected SGD transistors in a conductive state for the selected NAND strings, which receive Vbl_sel=0 V, but low enough to provide the selected SGD transistors in a non-conductive state for the inhibited NAND strings, which receive Vbl_unsel=2 V. Vsgd for the unselected sub-blocks, Vsgd_unsel (plot 1032) can be set to 0 V to provide the corresponding SGD transistors in a non-conductive state.

Subsequently, in the verify phase, one or more verify tests are performed by applying a verify signal (plot 1002) with one or more verify voltages on WLn and, for each verify voltage, sensing the conductive state of the memory cells in the selected NAND strings of the selected sub-block. The SGD and SGS transistors are in a strongly conductive state to allow sensing to occur for the selected memory cells. During the verify tests, Vbl_sense=0.5 V is applied to the bit lines.

The voltages depicted are examples.

FIG. 11A depicts a process for programming and reprogramming sets of memory cells to tighten Vth distributions and improve data retention. Step 1100 includes programming a first set of memory cells connected to a first word line (WLn) in an initial program operation. For example, the program signal of FIG. 9A may be used to obtain the Vth distributions of FIG. 8A. Step 1101 includes programming a second set of memory cells connected to an adjacent second word line (WLn+1) in an initial program operation. Typically, the programming can proceed one word line at a time in a block or sub-block.

Steps 1102-1104 can be performed sometime after the programming by a control circuit when it reaches an idle state, so that there is no delay of other more important tasks. In one approach, a control circuit is configured to read a first memory cell of WLn, read a second memory cell of WLn+1, and decide whether to reprogram the first memory cell based on the control circuit entering an idle state after the programming of the second memory cell. In another option, the reading and the reprogramming are performed in response to receiving a read command involving the first set of memory cells, after the programming of the second set of memory cells.

Step 1102 includes reading the first set of memory cells to classify each memory cell's Vth into a respective Vth range (encompassing one or more data states). In one approach, each memory cell is classified into a single data state. In another approach, which provides less read accuracy but which can be sufficient in a simplified implementation, each cell is classified into a respective Vth range which encompasses multiple adjacent data states. For example, referring to FIG. 8B, a read operation may use read voltages VrA-VrF to determine the data states of the Er-E memory cells. The read voltage VrG can be omitted so that the F and G state memory cells are classified together in the Vth range 841. For example, when VrF is applied to WLn, the non-conductive memory cells, which have Vth>VrF, can be classified in the Vth range 841. Various other threshold voltage ranges and read voltages are discussed in connection with the program pulse tables of FIG. 12A-12F.

Step 1103 includes reading the second set of memory cells to classify each memory cell's Vth into a respective Vth range (encompassing one or more data states), as discussed in connection with step 1102. The respective Vth ranges can be the same as, or different than, in step 1102.

Step 1104 includes, for each memory cell in the first set of memory cells, reprogramming the memory cell if the respective Vth range is below a specified voltage (or the respective data state is below one or more highest data states) and if the respective Vth range of an adjacent memory cell of the second set of memory cells is below the specified voltage (or the respective data state is below one or more highest data states). For example, the specified voltage can be VrF as discussed in connection with FIG. 8B. Equivalently, the one or more highest data states can be the F and G states. In this case, a decision is made to reprogram a memory cell in the first set of memory cells if it, and the adjacent memory cell of the second set of memory cells, are in the Er-E states. Generally, a decision can be made to reprogram a first memory cell in the first set of memory cells based on whether the respective data state is below 25% of highest data states (e.g., F and G) of a plurality of data states (e.g., Er-G) and based on whether the respective data state of the adjacent second memory cell of the second set of memory cells is below 25% of highest data states of a plurality of data states.

A decision is made to not reprogram a memory cell in the first set of memory cells if it, and/or the adjacent memory cell of the second set of memory cells, are in the F or G states, e.g., in 25% of the highest data states. The specified voltage and the one or more highest data states for the first set of memory cells of WLn can be the same as, or different than, the second set of memory cells of WLn+1.

Recall from FIG. 8A-8C that reprogramming of lower state memory cells is most relevant in tightening the Vth distributions.

Optionally, the reprogramming is repeated multiple times at specified intervals.

FIG. 11B depicts a process for programming a set of memory cells in an initial program operation, consistent with step 1100 or 1101 of FIG. 11A. An initial program operation begins at step 1110. Step 1111 includes, for memory cells to be programmed (e.g., the memory cells assigned to states A-G in an eight-state approach), storing data in respective sets of latches to identify an assigned programmed data state among a plurality of data states. For example, the latches 194-197 of FIG. 2 may be used. Step 1111a includes, for memory cells which are not to be programmed (e.g., the memory cells assigned to the Er state), storing data in respective sets of latches to identify the erased data state.

Step 1112 includes performing a pre-charge phase of a program loop. In this phase, the program-inhibit voltage signal pre-charges the channels of the unselected NAND strings. See also FIG. 10. Steps 1112a-1112d are part of step 1112. Step 1112a includes reading sets of latches to identify memory cells to be programmed in the current program loop (PL). Step 1112b includes applying a program-enable voltage, e.g., 0 V, to respective bit lines of the memory cells to be programmed in the current PL. Step 1112c includes reading sets of latches to identify memory cells not to be programmed in the current PL. Step 1112d includes applying a program-inhibit voltage, e.g., 1-2 V, to respective bit lines of the memory cells which are not to be programmed in the current PL.

Step 1113 includes performing a program phase of the program loop. This can involve applying a program voltage to the selected word line and pass voltages to the unselected word line, as mentioned in connection with FIG. 10. Step 1114 includes performing a verify phase of the program loop. This can involve applying a verify voltage signal to the selected word line and a pass voltage to the unselected word lines, while sensing the selected memory cells, as mentioned in connection with FIG. 10.

Step 1115 includes updating data in the latches, based on the verify phase, to identify selected and unselected memory cells for the next program loop. The sensing results can also be output to the controller to allow it determine whether programming has been completed for a particular data state or whether the program operation has been completed.

A decision step 1116 determines whether there is a next program loop. If the decision step is true, step 1112 is repeated for the next program loop. If the decision step 1116 is false, the program operation is done at step 1117.

FIG. 11C depicts a process for reprogramming a set of memory cells, consistent with step 1104 of FIG. 11A. A reprograming operation begins at step 1120. Step 1121 includes setting a correspondence between the PL (or program pulse (PP) number) and the Vpgm (program pulse magnitude), e.g., at the program pulse table 117. FIG. 13A-13F2 depict examples of program loop number versus program pulse magnitude. In one approach, the program pulses increase in magnitude, starting at the lowest magnitude of a program pulse table, such as in FIG. 12A-12F, and ending at the highest magnitude. In cases such as FIGS. 12B1 and 12B2, the program pulse magnitudes can be grouped into two subsets, where a reprogramming operation is performed with each subset.

Step 1122 sets the program loop number PL=1. Step 1123 includes, for memory cells to be reprogrammed, storing data in respective sets of latches to identify a respective PL for programming Identifying a PL among a plurality of PLs of the reprogramming operation acts to identify a program pulse magnitude among a plurality of program pulse magnitudes. For example, the latches 194-197 of FIG. 2 may be used. Step 1123*a* includes, for memory cells which are not to be reprogrammed, e.g., in the reprogramming operation, store data in respective sets of latches to inhibit programming.

Step 1124 includes performing a pre-charge phase of a program loop, similar to step 1112 in FIG. 11B. Steps 1124*a*-1124*d* are part of step 1124. Step 1124*a* includes reading sets of latches to identify memory cells to be reprogrammed in the current program loop (e.g., the memory cells referred to in step 1123). Step 1124*b* includes applying a program-enable voltage, e.g., 0 V, to respective bit lines of the memory cells to be reprogrammed in the current PL. Step 1124*c* includes reading sets of latches to identify memory cells not to be reprogrammed in the current PL. Step 1124*d* includes applying a program-inhibit voltage, e.g., 1-2 V, to respective bit lines of the memory cells which are not to be reprogrammed in the current PL.

Step 1124 includes performing a program phase of the program loop, similar to step 1113 of FIG. 11C. The reprogramming operation can omit the verify phase of the program loop of FIG. 10, in one approach, to save time. Thus, a reprogramming operation can use the voltage signals in the time period t0-t8 of FIG. 10. The reprogramming operation can also omit the pre-charge phase of the program loop of FIG. 10 to save additional time.

A decision step 1125 determines whether there is a next program loop. If the decision step is true, PL is incremented at step 1127 and step 1124 is repeated for the next program loop. If the decision step 1125 is false, the reprogramming operation is done at step 1126.

FIG. 11C1 depicts a process for reprogramming a set of memory cells in multiple operations, consistent with step 1104 of FIG. 11A. Step 1128 includes performing a first reprogramming operation for one portion of lower data state memory cells of a set of memory cells of WLn, and applying a first subset of program pulse magnitudes to WLn. For example, in FIG. 12B1, the one portion of lower data state memory cells of a set of memory cells of WLn can be the memory cells in states A-D (which are adjacent to memory cells of states Er-E on WLn+1), and the first subset of program pulse magnitudes can be 14.75-18 V in 0.25 V increments. Step 1129 includes performing a second reprogramming operation for another portion of the lower data state memory cells of the set of memory cells of WLn, and applying a second subset of program pulse magnitudes to WLn. For example, in FIG. 12B2, the another portion of lower data state memory cells of a set of memory cells of WLn can be memory cells in states D and E (which are adjacent to memory cells of states Er-E on WLn+1), and the second subset of program pulse magnitudes can be 18.25-20 V in 0.25 V increments. The lower data state memory cells include states A-E, or Er-E and the one portion and the another portion of the lower data state memory cells overlap in that they both include the D state.

By performing separate reprogramming operations, a large number of different program pulse magnitudes can be used to provide highly accurate reprogramming without requiring an excessive number of data state latches for each NAND string. For example, the program pulse table of FIG. 12B includes twenty-two different magnitudes, ranging from 14.75-20 V in increments of 0.25 V. This requires five data state latches to identify which program pulse to apply to a given memory cell, since five binary latches can store up to thirty-two different values. Four binary latches are insufficient because they can store only up to sixteen different values. In contrast, the table of FIG. 12B1 includes fourteen different magnitudes (the underlined voltages), ranging from 14.75-18 V in increments of 0.25 V. Four data state latches are sufficient to identify which program pulse to apply to a given memory cell. The table of FIG. 12B2 includes eight different magnitudes (the underlined voltages), ranging from 18.25-20 V in increments of 0.25 V. Therefore, the four data state latches are again sufficient to handle the separate reprogramming operations.

Figure 11D:
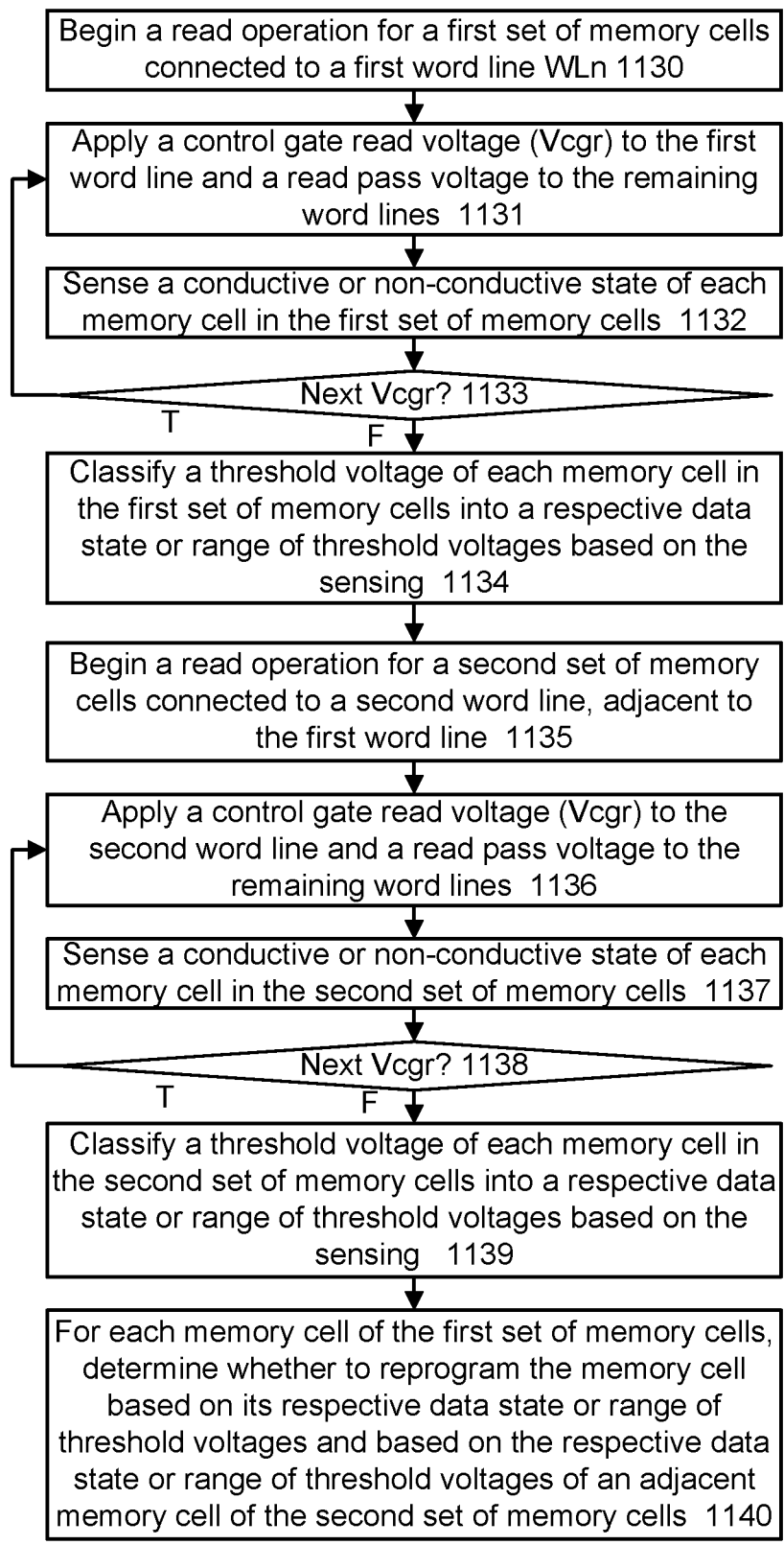
FIG. 11D depicts a process for reading a set of memory cells, consistent with step 1102 or 1103 of FIG. 11A.

FIG. 11D depicts a process for reading a set of memory cells, consistent with step 1102 or 1103 of FIG. 11A. Step 1130 begins a read operation for a first set of memory cells connected to a first word line WLn. Step 1131 includes applying a control gate read voltage (Vcgr) to the first word line and a read pass voltage to the remaining, unselected word lines. Step 1132 includes sensing a conductive or non-conductive state of each memory cell in the first set of memory cells. A decision step 1133 determines whether a next Vcgr is to be applied. If the decision step 1133 is true, step 1131 is repeated. If the decision step 1133 is false, the reading is completed and step 1134 includes classifying a threshold voltage of each memory cell in the first set of memory cells into a respective data state or range of threshold voltages based on the sensing, as discussed.

Steps 1134 and 1139 together can identify lower data state memory cells (e.g., in the Er-E states) of the first set of memory cells which are adjacent to lower data state memory cells (e.g., in the Er-E states) of the second set of memory cells, and higher data state memory cells of the first set of memory cells (e.g., in the F and G states) which are adjacent to higher data state memory cells of the second set of memory cells (e.g., in the F and G states). The lower data state memory cells of the first set of memory cells and the lower data state memory cells of the second set of memory cells comprise a lowest programmed data state (e.g., A state) of a plurality of data states; and the higher data state memory cells of the first set of memory cells and the higher data state memory cells of the second set of memory cells comprise a highest data state (e.g., G state) of the plurality of data states.

Step 1135 begins a read operation for a second set of memory cells connected to a second word line WLn+1. Step 1136 includes applying a control gate read voltage (Vcgr) to the second word line and a read pass voltage to the remaining, unselected word lines. Step 1137 includes sensing a conductive or non-conductive state of each memory cell in the second set of memory cells. A decision step 1138 determines whether a next Vcgr is to be applied. If the decision step 1138 is true, step 1136 is repeated. If the decision step 1138 is false, the reading is completed and step 1139 includes classifying a threshold voltage of each memory cell in the second set of memory cells into a respective data state or range of threshold voltages based on the sensing, as discussed.

Step 1140 includes, for each memory cell of the first set of memory cells, determining whether to reprogram the memory cell based on its respective data state or range of threshold voltages and based on the respective data state or range of threshold voltages of an adjacent memory cell of the second set of memory cells. See also FIG. 11A, step 1104 and FIG. 11E.

In one approach, the data states of the WLn memory cell and the adjacent WLn+1 memory cell, in a pair of memory cells, can be stored in an associated set of latches. In another approach, the data state of one memory cell of the pair is stored in an associated set of latches, and the data state of the other memory cell of the pair is stored in another location, such as the off-chip controller 122, e.g., at the ECC engine 245, or at an on-chip location such as the circuitry 110.

Figure 11E:
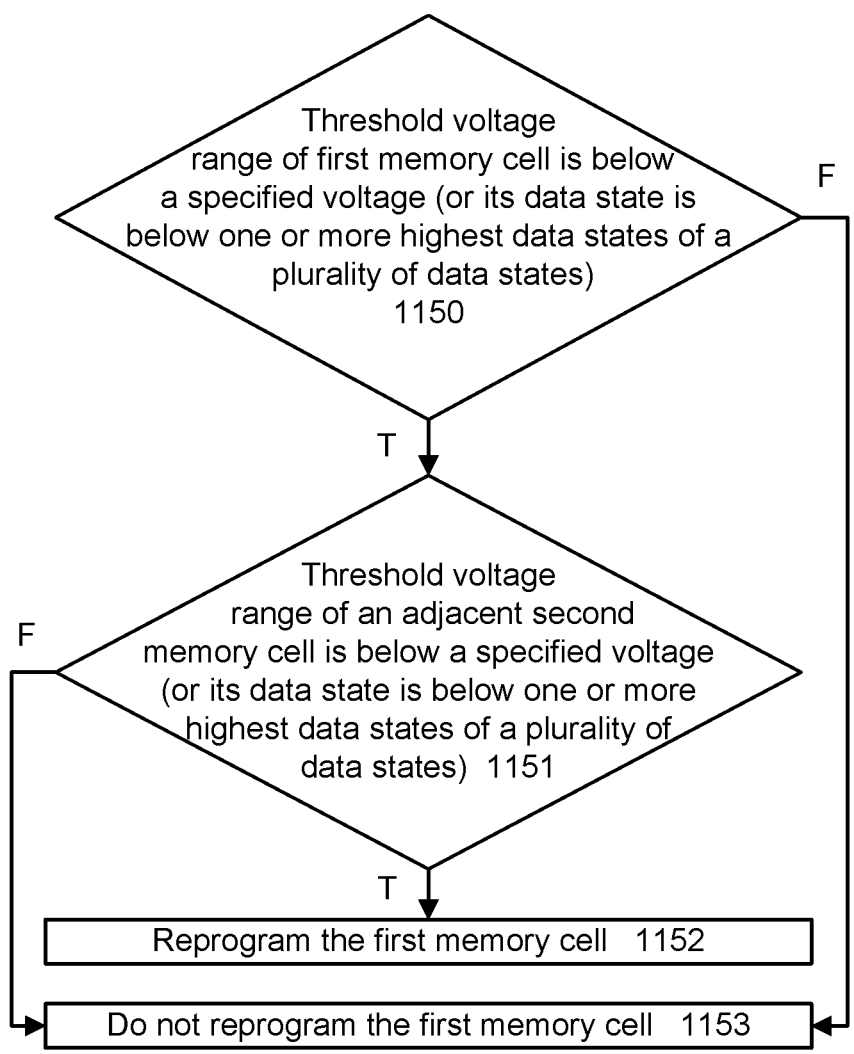
FIG. 11E depicts a process for determining whether to reprogram a memory cell, consistent with step 1140 of FIG. 11D.

FIG. 11E depicts a process for determining whether to reprogram a memory cell, consistent with step 1140 of FIG. 11D. An example memory cell in the first set of memory cells is referred to as a first memory cell, and an example adjacent memory cell in the second set of memory cells is referred to as a second memory cell. The process can be performed for each memory cell in the first set of memory cells. A decision step 1150 determines whether a threshold voltage range of a first memory cell is below a specified voltage (or its data state is below one or more highest data states of a plurality of data states). For example, in FIG. 8B, VrF could be the specified voltage and the one or more highest data states could be the F and G states. The decision step therefore can determine whether the first memory cell is in the Er-E state. If the decision step 1150 is false, step 1153 indicates that a decision is made to not reprogram the first memory cell. For example, the first memory cell may not be reprogrammed if it is in the F or G state. If the decision step 1150 is true, a decision step 1151 is reached.

The decision step 1151 determines whether a threshold voltage range of the adjacent second memory cell is below a specified voltage (or its data state is below one or more highest data states of a plurality of data states). If the decision step 1151 is false, step 1153 indicates that the first memory cell is not reprogrammed. For example, the first memory cell may not be reprogrammed if the adjacent second memory cell is in the F or G state. If the decision step 1151 is true, step 1152 indicates that a decision is made to reprogram the first memory cell.

The program pulse tables of FIG. 12A-12F depict example program pulse voltages or magnitudes. Each table lists data states of a WLn memory cell in the left hand column and data states of an adjacent WLn+1 memory cell in the top row. For each pair of WLn data state and WLn+1 data state, there is a corresponding program pulse magnitude which is used to reprogram a corresponding WLn memory cell. The notation "n.a." denotes not applicable, meaning there is no reprogramming for the indicated pair of WLn and WLn+1 data states. In FIGS. 12A and 12C-12F, the dashed line boxes identify program pulse magnitudes of grouped data states.

FIG. 12A depicts a first example table of program pulse magnitudes for reprogramming, consistent with FIG. 11A, where the program pulse magnitudes for the data states Er-E of WLn+1 are grouped. Generally, grouping of the WLn and/or WLn+1 data states reduces the implementation complexity since it reduces the number of different program pulse magnitudes and read operations. This example groups the WLn+1 data states. This approach may still provide a good result since it tailors the program pulse magnitude to the data state of the WLn memory cell. There are five program pulse magnitudes, ranging from 16-20 V in 1 V increments. When the WLn memory cell is in the Er, F or G state, there is no reprogramming. Also, when the WLn+1 memory cell is in the F or G state, there is no reprogramming. This applies in each of the example program pulse tables provided herein. When the WLn memory cell is in the A-E state, the program pulse magnitude is 16-20 V, respectively.

It is sufficient to perform one read operation using VrF for WLn+1 to identify the memory cells as being in the Er-E Vth range or the F and G Vth range. It is sufficient to perform read operations using VrA-VrF but not VrG for WLn since, as with WLn+1, the F and G state memory cells of WLn do not have to be distinguished from one another.

FIG. 12B depicts a second example table of program pulse magnitudes for reprogramming, consistent with FIG. 11A, where the program pulse magnitudes for the A-E state memory cells of WLn vary as the data states of the memory cells of WLn+1 vary between Er-E. This example tailors the program pulse magnitude to each different pair of WLn state and WLn+1 state.

When the WLn memory cell is in the A-E state and the WLn+1 memory cell is in the Er state, the program pulse magnitude is 16-20 V, respectively. When the WLn memory cell is in the A-E state and the WLn+1 memory cell is in the A state, the program pulse magnitude is 15.75-19.75 V, respectively. When the WLn memory cell is in the A-E state and the WLn+1 memory cell is in the B state, the program pulse magnitude is 15.50-19.50 V, respectively. When the WLn memory cell is in the A-E state and the WLn+1 memory cell is in the C state, the program pulse magnitude is 15.25-19.25 V, respectively. When the WLn memory cell is in the A-E state and the WLn+1 memory cell is in the D state, the program pulse magnitude is 15-19 V, respectively. When the WLn memory cell is in the A-E state and the WLn+1 memory cell is in the E state, the program pulse magnitude is 14.75-18.75 V, respectively. Note that it is efficient when some program pulse magnitudes are used for multiple combinations of WLn/WLn+1 data states.

The program pulse magnitude is relatively high when the data state of the WLn memory cell (first memory cell) is relatively high and when the data state of the adjacent WLn+1 memory cell (second memory cell) is relatively low.

Generally, a relatively low program pulse is sufficient to increase the Vth of a memory cell by a given amount when the memory cell is in a relatively low data state and has a relatively low Vth. Further, the program pulse magnitude can be relatively small when the amount by which the data state or Vth of the WLn+1 memory cell exceeds the data state or Vth of the WLn memory cell is relatively large.

This example includes twenty-two different program pulse magnitudes, e.g., 14.75-20 V in 0.25 V increments, which require five binary latches to store data to identify each magnitude. As mentioned, e.g., in connection with FIG. 11C, during reprogramming of a memory cell, the data in the respective set of latches can be read to determine whether to inhibit or enable programming of the memory cell during the application of a given program pulse to the word line. Also as mentioned, it can be helpful to divide a reprogramming into multiple reprogramming operations, where the latches of the NAND strings are configured differently in each reprogramming operation, to reduce the required number of latches for identifying the program pulse magnitudes. FIGS. 12B1 and 12B2 provides examples of first and second reprogramming operations using the program pulse magnitudes of FIG. 12B.

Read operations can be performed for WLn and WLn+1 using VrA-VrF but not VrG.

FIG. 12B1 depicts a third example table of program pulse magnitudes comprising a first subset of the program pulse magnitudes of FIG. 12B, ranging from 14.75-18 V, for use in the first reprogramming operation of FIG. 11C1, step 1128. The underlined voltages are used in the current reprograming operation.

When the WLn memory cell is in the A-C state and the WLn+1 memory cell is in the Er state, the program pulse magnitude is 16-18 V, respectively. When the WLn memory cell is in the A-C state and the WLn+1 memory cell is in the A state, the program pulse magnitude is 15.75-17.75 V, respectively. When the WLn memory cell is in the A-C state and the WLn+1 memory cell is in the B state, the program pulse magnitude is 15.50-17.50 V, respectively. When the WLn memory cell is in the A-C state and the WLn+1 memory cell is in the C state, the program pulse magnitude is 15.25-17.25 V, respectively. When the WLn memory cell is in the A-D state and the WLn+1 memory cell is in the D state, the program pulse magnitude is 15-18 V, respectively. When the WLn memory cell is in the A-D state and the WLn+1 memory cell is in the E state, the program pulse magnitude is 14.75-17.75 V, respectively.

This example includes fourteen different program pulse magnitudes, which requires four binary latches to store data to identify each magnitude.

FIG. 12B2 depicts a fourth example table of program pulse magnitudes comprising a second subset of the program pulse magnitudes of FIG. 12B, ranging from 18.25-20 V, for use in the second reprogramming operation of FIG. 11C1, step 1129. The underlined voltages are used in the current reprograming operation.

When the WLn memory cell is in the D or E state and the WLn+1 memory cell is in the Er state, the program pulse magnitude is 19 or 20 V, respectively. When the WLn memory cell is in the D or E state and the WLn+1 memory cell is in the A state, the program pulse magnitude is 18.75 or 19.75 V, respectively. When the WLn memory cell is in the D or E state and the WLn+1 memory cell is in the B state, the program pulse magnitude is 18.50 or 19.50 V, respectively. When the WLn memory cell is in the D or E state and the WLn+1 memory cell is in the C state, the program pulse magnitude is 18.25 or 19.25 V, respectively. When the WLn memory cell is in the E state and the WLn+1 memory cell is in the D state, the program pulse magnitude is 19 V. When the WLn memory cell is in the E state and the WLn+1 memory cell is in the E state, the program pulse magnitude is 18.75 V.

This example includes eight different program pulse magnitudes, which can be handled by the four binary latches used for the first reprogramming operation.

The number of read operations can also be reduced in each reprogramming operation when multiple reprogramming operations are performed. For example, five read voltages, VrA-VrE (see FIG. 8B) can be used in the first reprogramming operation. Read operations using VrF and VrG can be omitted since it is not necessary to distinguish between the E, F and G states. It is sufficient to distinguish between the D state and the higher E-G states using VrE.

Three read voltages, VrD-VrF (see FIG. 8B) can be used in the second reprogramming operation. Read operations using VrA-VrC can be omitted since it is not necessary to distinguish between the Er-C states. It is sufficient to distinguish between the D state and the lower Er-C states using VrD. Read operations using VrG can be omitted since it is not necessary to distinguish between the F and G states. It is sufficient to distinguish between the E state and the higher F and G states using VrF.

Note that the program pulse magnitudes can be divided up in the different reprogramming operations in different ways. In another example, the WLn=D/WLn+1=D and WLn=D/WLn+1=E combinations in FIG. 12B1 can be moved to the second reprogramming operation of FIG. 12B2. This would result in ten different program pulse magnitudes in the second reprogramming operation, while keeping fourteen program pulse magnitudes in the first reprogramming operation. There would be one less read operation for WLn in this modification of FIG. 12B1 since VrE can be omitted. It would be sufficient to read using VrA-VrD instead of VrA-VrE.

FIG. 12C depicts a fifth example table of program pulse magnitudes for reprogramming, consistent with FIG. 11A, where the program pulse magnitudes for the data states Er-B and C-E of WLn+1 form first and second groups, respectively. Read operations can be performed for WLn using VrA-VrF but not VrG. Read operations can be performed for WLn+1 using VrC and VrF.

The grouping here significantly reduces the number of read operations on WLn+1. Also, there are only ten different program pulse magnitude.

When the WLn memory cell is in the A state and the WLn+1 memory cell is in the Er-B or C-E state, the program pulse magnitude is 15.75 or 15 V, respectively. When the WLn memory cell is in the B state and the WLn+1 memory cell is in the Er-B or C-E state, the program pulse magnitude is 16.75 or 16 V, respectively. When the WLn memory cell is in the C state and the WLn+1 memory cell is in the Er-B or C-E state, the program pulse magnitude is 17.75 or 17 V, respectively. When the WLn memory cell is in the D state and the WLn+1 memory cell is in the Er-B or C-E state, the program pulse magnitude is 18.75 or 18 V, respectively. When the WLn memory cell is in the E state and the WLn+1 memory cell is in the Er-B or C-E state, the program pulse magnitude is 19.75 or 19 V, respectively.

FIG. 12D depicts a sixth example table of program pulse magnitudes for reprogramming, consistent with FIG. 11A, where the program pulse magnitudes for the data states A and B of WLn and Er-E of WLn+1 form a first group, and the program pulse magnitudes for the data states C-E of WLn and Er-E of WLn+1 form a second group. This example groups data states of WLn into a first subset of data states A and B and a second subset of data states C-E. Read operations can be performed for WLn using VrA, VrC and VrF. Read operations can be performed for WLn+1 using VrF.

The grouping here significantly reduces the number of read operations on WLn and WLn+1. Also, there are only two different program pulse magnitudes, e.g., 16.5 V and 19 V.

When the WLn memory cell is in the A or B state and the WLn+1 memory cell is in the Er-E state, the program pulse magnitude is 16.5 V. When the WLn memory cell is in the C-E state and the WLn+1 memory cell is in the Er-E state, the program pulse magnitude is 19 V.

FIG. 12E depicts a seventh example table of program pulse magnitudes for reprogramming, consistent with FIG. 11A, where the program pulse magnitudes for the data states Er and A, B and C, and D and E of WLn+1 form first, second and third groups, respectively. Read operations can be performed for WLn using VrA and VrF. Read operations can be performed for WLn+1 using VrB, VrD and VrF.

The grouping here significantly reduces the number of read operations on WLn+1 and the number of different program pulse magnitudes. There are eleven different program pulse magnitudes, e.g., 14.87-19.87 V in 0.5 V increments.

When the WLn memory cell is in the A state and the WLn+1 memory cell is in the Er or A state, B or C state, or D or E state, the program pulse magnitude is 15.87, 15.37 or 14.87, respectively. When the WLn memory cell is in the B state and the WLn+1 memory cell is in the Er or A state, B or C state, or D or E state, the program pulse magnitude is 16.87, 16.37 or 15.87, respectively. When the WLn memory cell is in the C state and the WLn+1 memory cell is in the Er or A state, B or C state, or D or E state, the program pulse magnitude is 17.87, 17.37 or 16.87, respectively. When the WLn memory cell is in the D state and the WLn+1 memory cell is in the Er or A state, B or C state, or D or E state, the program pulse magnitude is 18.87, 18.37 or 17.87, respectively. When the WLn memory cell is in the E state and the WLn+1 memory cell is in the Er or A state, B or C state, or D or E state, the program pulse magnitude is 19.87, 19.37 or 18.87, respectively.

FIG. 12F depicts an eighth example table of program pulse magnitudes for reprogramming, consistent with FIG. 11A, where the program pulse magnitudes for the data states A-C of WLn and Er-B of WLn+1, A-C of WLn and C-E of WLn+1, D and E of WLn and Er-B of WLn+1, and D and E of WLn and C-E of WLn+1 form first, second, third and fourth groups, respectively. The groups of program pulse magnitudes are obtained by grouping data states of both WLn and WLn+1. The grouping here significantly reduces the number of read operations on WLn and WLn+1 and the number of different program pulse magnitudes. There are four different program pulse magnitudes, e.g., 16, 16.75, 18.5 and 19.25 V.

When the WLn memory cell is in the A-C state and the WLn+1 memory cell is in the Er-B state or C-E state, the program pulse magnitude is 16.75 or 16 V, respectively. When the WLn memory cell is in the D or E state and the WLn+1 memory cell is in the Er-B state or C-E state, the program pulse magnitude is 19.25 or 18.5 V, respectively.

Some of the program pulse magnitudes of FIG. 12C-12F are obtained by interpolating between values in the table of FIG. 12B.

FIG. 13A-13F depict series of program pulses applied to a word line WLn to reprogram memory cells connected to the word line. The vertical axis depicts voltage and the horizontal axis depicts time or program loop (PL) number. During each program pulse, some memory cells are inhibited from programming while others are enabled to be programmed, such as by setting their bit line voltages to a high or low level, respectively. The decision of whether to inhibit or enable a memory cell during a given program pulse can be based on data in its latches which identify the program pulse magnitude, or the corresponding program pulse number, in which the memory cell should be enabled. As mentioned, for each memory cell of WLn, the decision can be based on a pair of data states, e.g., the data state of the WLn memory cell and the data state of the adjacent WLn+1 memory cell. FIG. 13A-13F depict data state pairs for which programming is enabled. In some cases, a range of data states is provided instead of a single data state. The remaining data state pairs, not shown, indicate that the WLn memory cell is inhibited from programming during the program pulse.

The program pulses are depicted as being uniform in duration in the different examples. However, it is possible for the program pulse duration to vary along with the magnitude. It is also possible to use different program-enable bit line voltages to potentially reduce the number of program pulses. For instance, in FIG. 13B, there is a relatively small 0.25 V step size in the program pulses. The data state combinations for PP=1 can be combined with the data state combinations for PP=2. For instance, the 15 V program pulse of PP=2 can be applied to WLn while applying a program-enable voltage such as 0 V for the data state combinations of A/D and a higher program-enable voltage such as 0.25 V, which is below the program-inhibit voltage, for the data state combinations of A/E. These two data state combinations can therefore be programmed concurrently. The control gate-to-drain voltage of the WLn memory cells with the A/E combination is about the same with Vcg=15 V and Vbl=0.25 V as with Vcg=14.75 V and Vbl=0 V. Following this example, the number of program pulses can potentially cut in half. For instance, the data state combinations for PP=1, 3, 5, 7, 9, 11, 13, 15, 17, 19 and 21 can be combined with the data state combinations for PP=2, 4, 6, 8, 10, 12, 14, 16, 18, 20 and 22, respectively.

FIG. 13A depicts a plot of program pulses for a reprogramming operation, and an indication of combinations of data states of WLn memory cells and adjacent WLn+1 memory cells which are enabled for each program pulse, consistent with FIG. 12A. The five program pulses (PP) 1300 (labelled 1-5) have magnitudes of 16-20 V as indicated. A region 1301 of the plot shows which WLn memory cells are enabled for each program pulse based on their respective data state and the data state of the adjacent WLn+1 memory cell. For example, the notation A/Er-E under PP=1 denotes a pair of data states, namely the A state on WLn and any of the Er-E states on WLn+1. The notation is in the format of "WLn data state/WLn+1 data state," e.g., "data state of a first memory cell of WLn/data state of an adjacent second memory cell of WLn+1." The A/Er-E, B/Er-E, C/Er-E, D/Er-E and E/Er-E data state pairs are enabled in program pulses 1-5, respectively.

Figure 13B:
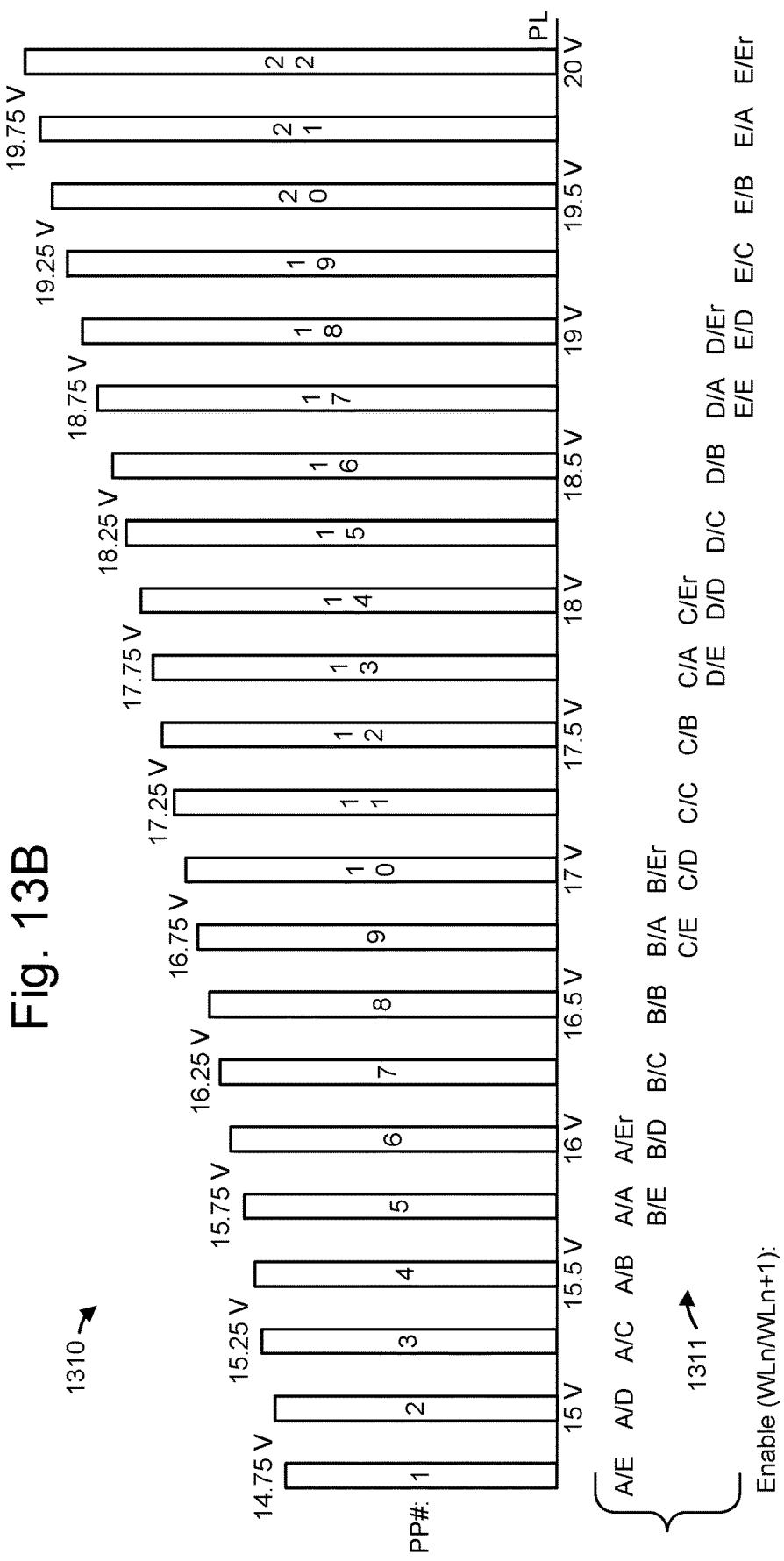
FIG. 13B depicts a plot of program pulses for a reprogramming operation, and an indication of combinations of data states of WLn memory cells and adjacent WLn+1 memory cells which are enabled for each program pulse, consistent with FIG. 12B.

FIG. 13B depicts a plot of program pulses for a reprogramming operation, and an indication of combinations of data states of WLn memory cells and adjacent WLn+1 memory cells which are enabled for each program pulse, consistent with FIG. 12B. The twenty-two program pulses 1310 (labelled 1-22) have magnitudes of 14.75-20 V, as indicated. A region 1311 of the plot indicates the enabled data state pairs are A/E for PP=1, A/D for PP=2, A/C for PP=3, A/B for PP=4, A/A and B/E for PP=5, A/Er and B/D for PP=6, B/C for PP=7, B/B for PP=8, B/A and C/E for PP=9, B/Er and C/D for PP=10, C/C for PP=11, C/B for PP=12, C/A and D/E for PP=13, C/Er and D/D for PP=14, D/C for PP=15, D/B for PP=16, D/A and E/E for PP=17, D/Er and E/D for PP=18, E/C for PP=19, E/B for PP=20, E/A for PP=21 and E/Er for PP=22.

FIG. 13B1 depicts a plot of program pulses for a reprogramming operation, and an indication of combinations of data states of WLn memory cells and adjacent WLn+1 memory cells which are enabled for each program pulse, consistent with FIG. 12B1. The fourteen program pulses 1320 (labelled 1-14) have magnitudes of 14.75-18 V, as indicated. A region 1321 of the plot indicates the enabled data state pairs are A/E for PP=1, A/D for PP=2, A/C for PP=3, A/B for PP=4, A/A and B/E for PP=5, A/Er and B/D for PP=6, B/C for PP=7, B/B for PP=8, B/A and C/E for PP=9, B/Er and C/D for PP=10, C/C for PP=11, C/B for PP=12, C/A and D/E for PP=13, and C/Er and D/D for PP=14.

FIG. 13B2 depicts a plot of program pulses for a reprogramming operation, and an indication of combinations of data states of WLn memory cells and adjacent WLn+1 memory cells which are enabled for each program pulse, consistent with FIG. 12B2. The eight program pulses 1330 (labelled 1-8) have magnitudes of 18.25-20 V, as indicated. A region 1331 of the plot indicates the enabled data state pairs are D/C for PP=1, D/B for PP=2, D/A and E/E for PP=3, D/Er and E/D for PP=4, E/C for PP=5, E/B for PP=6, E/A for PP=7 and E/Er for PP=8.

FIG. 13C depicts a plot of program pulses for a reprogramming operation, and an indication of combinations of data states of WLn memory cells and adjacent WLn+1 memory cells which are enabled for each program pulse, consistent with FIG. 12C. The ten program pulses 1340 (labelled 1-10) have magnitudes of 15-19.75, as indicated. A region 1341 of the plot indicates the enabled data state pairs are A/C-E for PP=1, A/Er-B for PP=2, B/C-E for PP=3, B/Er-B for PP=4, C/C-E for PP=5, C/Er-B for PP=6, D/C-E for PP=7, D/Er-B for PP=8, E/C-E for PP=9 and E/Er-B for PP=10.

Figure 13D:
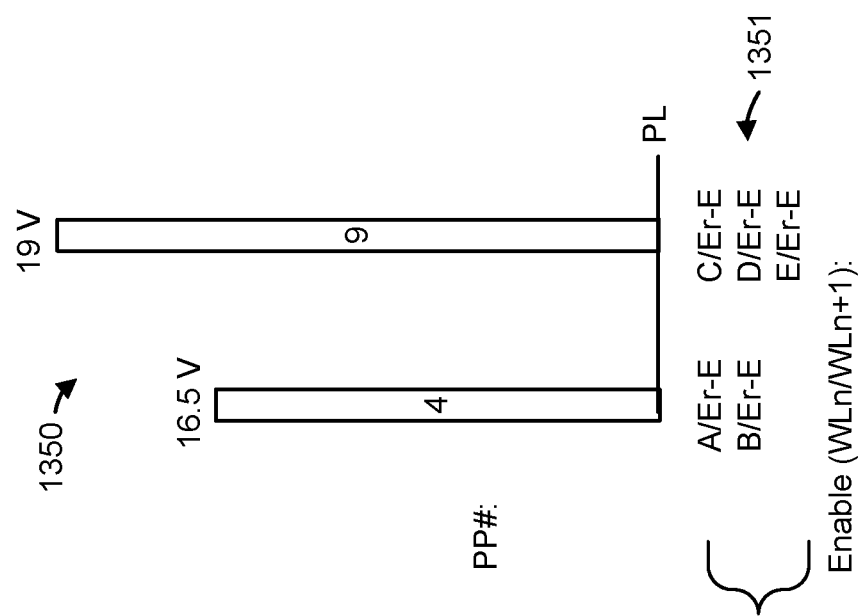
FIG. 13D depicts a plot of program pulses for a reprogramming operation, and an indication of combinations of data states of WLn memory cells and adjacent WLn+1 memory cells which are enabled for each program pulse, consistent with FIG. 12D.
Figure 13F:
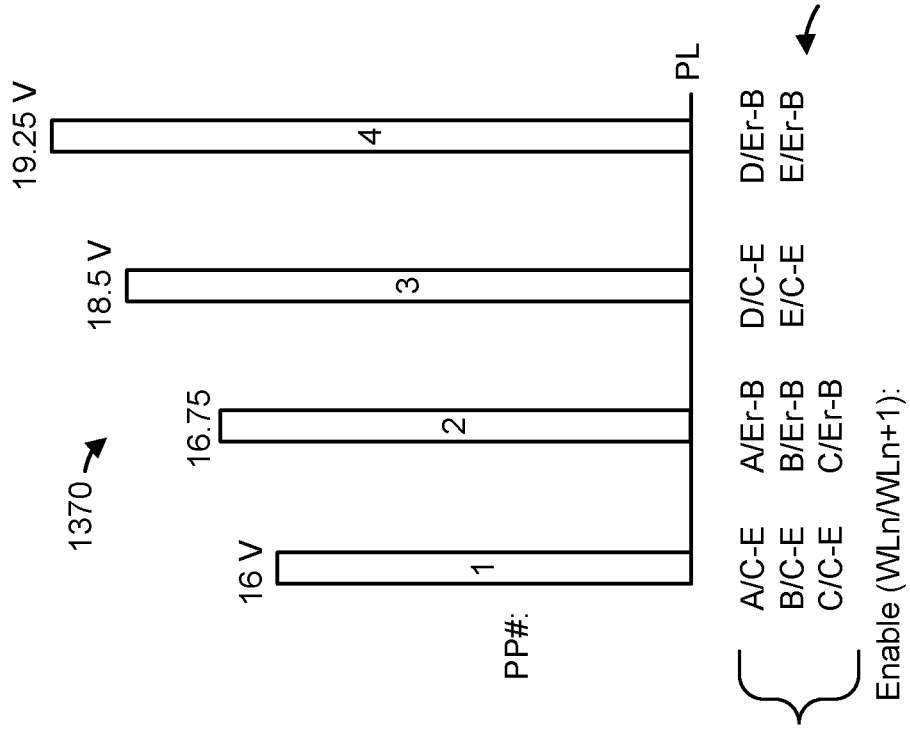
FIG. 13F depicts a plot of program pulses for a reprogramming operation, and an indication of combinations of data states of WLn memory cells and adjacent WLn+1 memory cells which are enabled for each program pulse, consistent with FIG. 12F.

FIG. 13D depicts a plot of program pulses for a reprogramming operation, and an indication of combinations of data states of WLn memory cells and adjacent WLn+1 memory cells which are enabled for each program pulse, consistent with FIG. 12D. The two program pulses 1350 (labelled 1 and 2) have magnitudes of 16.5 and 19 V, respectively, as indicated. A region 1351 of the plot indicates the enabled data state pairs are A/Er-E and B/Er-E for PP=1, and C/Er-E, D/Er-E and E/Er-E for PP=2.

FIG. 13E depicts a plot of program pulses for a reprogramming operation, and an indication of combinations of data states of WLn memory cells and adjacent WLn+1 memory cells which are enabled for each program pulse, consistent with FIG. 12E. The eleven program pulses 1360 (labelled 1-11) have magnitudes of 14.87-19.87 V, as indicated. A region 1361 of the plot indicates the enabled data state pairs are A/D-E for PP=1, A/B-C for PP=2, A/Er-A and B/D-E for PP=3, B/B-C for PP=4, B/Er-A and C/D-E for PP=5, C/B-C for PP=6, C/Er-A and D/D-E for PP=7, D/B-C for PP=8, D/Er-A and E/D-E for PP=9, E/B-C for PP=10 and E/Er-A for PP=11.

FIG. 13F depicts a plot of program pulses for a reprogramming operation, and an indication of combinations of data states of WLn memory cells and adjacent WLn+1 memory cells which are enabled for each program pulse, consistent with FIG. 12F. The four program pulses 1370 (labelled 1-4) have magnitudes of 16-19.25 V, as indicated. A region 1371 of the plot indicates the enabled data state pairs are A/C-E, B/C-E and C/C-E for PP=1, A/Er-B, B/Er-B and C/Er-B for PP=2, D/C-E and E/C-E for PP=3 and D/Er-B and E/Er-B for PP=4.

Figure 14:
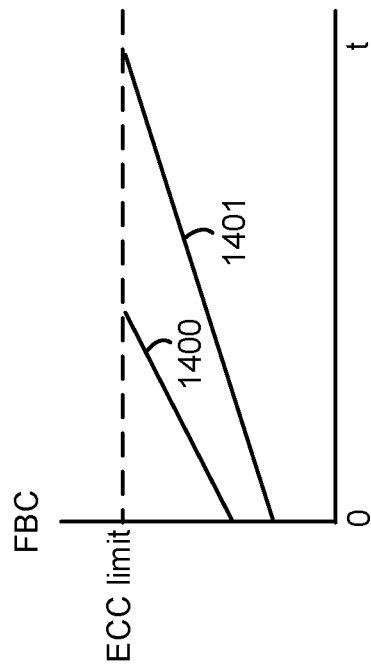
FIG. 14 depicts plots of fail bit count versus time, with and without reprogramming.

FIG. 14 depicts plots of fail bit count versus time, with and without reprogramming. As mentioned, the reprogramming techniques provided herein can tighten Vth distributions and improve data retention. The improvements can be measured in terms of a fail bit count (FBC) or number of errors in a read operation. The number of errors should be below an ECC limit as depicted by a dashed line. In this case, the memory cells are programmed at t=0 and a subsequent read operation is performed after some time has passed. The plot 1400 represents the case of not performing reprogramming, in which case the FBC increases relatively quickly toward the ECC limit. The plot 1401 represents the case of reprogramming, in which case the FBC increases relatively slowly toward the ECC limit.

In particular, at t=0, the FBC is lower when the reprogramming is performed since the Vth distributions are narrower. After t=0, the FBC increases as time increases due to data retention loss. The data retention loss is lower when the reprogramming is performed because the reprogramming increases the Vth after an initial amount of data retention loss has occurred.

Accordingly, it can be see that in one implementation, an apparatus comprises: a set of memory cells arranged in a set of NAND strings; a set of word lines connected to the set of memory cells, the set of word lines comprises a first word line connected to a first memory cell in the set of memory cells and a second word line connected to a second memory cell in the set of memory cells, the first memory cell is adjacent to the second memory cell; and a control circuit connected to the set of memory cells. The control circuit is configured to program the first memory cell, program the second memory cell after programming the first memory cell, read the first memory cell after the programming of the second memory cell to classify a threshold voltage of the first memory cell into a respective range of threshold voltages, read the second memory cell after the programming of the second memory cell to classify a threshold voltage of the second memory cell into a respective range of threshold voltages, and decide whether to reprogram the first memory cell based on the respective range of threshold voltages of the first memory cell and the respective range of threshold voltages of the second memory cell.

In another implementation, a method comprises: programming a first set of memory cells connected to a first word line to a plurality of data states; programming a second set of memory cells connected to a second word line to the plurality of data states, the second word line is adjacent to the first word line; after the programming of the second set of memory cells, reading a respective data state of each memory cell in the first set of memory cells and a respective data state of each memory cell in the second set of memory cells, identify a subset of the first set of memory cells to be reprogrammed based on the reading, and reprogramming the subset of the first set of memory cells, the reprogramming comprises applying a plurality of program pulses to the first word line; and for each memory cell of the subset of the first set of memory cells, enabling reprogramming of the memory cell during a respective program pulse of the plurality of program pulses and inhibiting reprogramming of the memory cell during remaining program pulses of the plurality of program pulses.

In another implementation, an apparatus comprises: a first set of memory cells connected to a first word line in a block; a second set of memory cells connected to a second word line in the block, wherein the first word line is adjacent to the second word line and the first set of memory cells; and a control circuit. The control circuit is configured to: program the first set of memory cells to a set of data states; program the second set of memory cells to the set of data states after programming the first set of memory cells; read the first set of memory cells and the second set of memory cells; and based on the reading, identify lower data state memory cells of the first set of memory cells which are adjacent to lower data state memory cells of the second set of memory cells, and higher data state memory cells of the first set of memory cells which are adjacent to higher data state memory cells of the second set of memory cells; and reprogram the lower data state memory cells of the first set of memory cells which are adjacent to the lower data state memory cells of the second set of memory cells while inhibiting reprogramming of the higher data state memory cells of the first set of memory cells which are adjacent to the higher data state memory cells of the second set of memory cells.

The foregoing detailed description of the invention has been presented for purposes of illustration and description.

It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of memory cells arranged in a set of NAND strings and to a set of word lines connected to the set of memory cells, the set of word lines comprises a first word line connected to a first memory cell in the set of memory cells and a second word line connected to a second memory cell in the set of memory cells, the first memory cell is adjacent to the second memory cell, and the control circuit is configured to:
program the first memory cell;
program the second memory cell after programming the first memory cell;
read the first memory cell after the programming of the second memory cell to classify a threshold voltage of the first memory cell into a respective range of threshold voltages;
read the second memory cell after the programming of the second memory cell to classify a threshold voltage of the second memory cell into a respective range of threshold voltages; and
decide whether to reprogram the first memory cell based on whether the respective range of threshold voltages of the first memory cell and the respective range of threshold voltages of the second memory cell are below a specified voltage.

2. The apparatus of claim 1, wherein:
the specified voltage is below a range of threshold voltages of one or more highest data states among a plurality of data states.

3. The apparatus of claim 1, wherein:
to perform the reprogramming, the control circuit is configured to set a program pulse magnitude of the first memory cell based on the respective range of threshold voltages of the first memory cell and the respective range of threshold voltages of the second memory cell.

4. The apparatus of claim 3, wherein:
the control circuit is configured to set the program pulse magnitude to be relatively high when the respective range of threshold voltages of the first memory cell is relatively high and the respective range of threshold voltages of the second memory cell is relatively low.

5. The apparatus of claim 3, wherein:
the control circuit is configured to set the program pulse magnitude to be relatively low when the respective range of threshold voltages of the first memory cell is relatively low and the respective range of threshold voltages of the second memory cell is relatively high.

6. The apparatus of claim 1, wherein:
the respective range of threshold voltages of the second memory cell encompasses multiple data states among a plurality of data states.

7. The apparatus of claim 1, wherein:
the control circuit is configured to read the first memory cell, read the second memory cell, and decide whether to reprogram the first memory cell based on the control circuit entering an idle state after the programming of the second memory cell.

8. The apparatus of claim 1, wherein:
the respective range of threshold voltages of the first memory cell encompasses a respective data state among a plurality of data states; and
the control circuit is configured to determine whether to reprogram the first memory cell based on whether the respective data state is below one or more highest data states of the plurality of data states.

9. The apparatus of claim 8, wherein:
the respective range of threshold voltages of the second memory cell encompasses a respective data state among the plurality of data states; and
the control circuit is configured to determine whether to reprogram the first memory cell based on whether the respective data state of the second memory cell is below one or more highest data states of the plurality of data states.

10. The apparatus of claim 1, wherein:
the respective range of threshold voltages of the first memory cell encompasses a respective data state among a plurality of data states; and
the control circuit is configured to determine whether to reprogram the first memory cell based on whether the respective data state is below 25% of highest data states of the plurality of data states.

11. A method, comprising:
programming a first set of memory cells connected to a first word line to a plurality of data states;
programming a second set of memory cells connected to a second word line to the plurality of data states, the second word line is adjacent to the first word line;
after the programming of the second set of memory cells, reading a respective data state of each memory cell in the first set of memory cells and a respective data state of each memory cell in the second set of memory cells, identify a subset of the first set of memory cells to be reprogrammed based on the reading, and reprogramming the subset of the first set of memory cells, the reprogramming comprises applying a plurality of program pulses to the first word line; and
for each memory cell of the subset of the first set of memory cells, enabling reprogramming of the memory cell during a respective program pulse of the plurality of program pulses and inhibiting reprogramming of the memory cell during remaining program pulses of the plurality of program pulses.

12. The method of claim 11, wherein:
the identifying the subset of the first set of memory cells to be reprogrammed comprises identifying pairs of adjacent memory cells, each pair comprising one memory cell from the first set of memory cells having a data state below one or more highest data states of the plurality of data states and one memory cell from the second set of memory cells having a data state below one or more highest data states of the plurality of data states.

13. The method of claim 11, wherein:
for each memory cell of the subset of the first set of memory cells for which reprogramming is enabled, the respective program pulse has a magnitude which is based on the respective data state of the memory cell and a respective data state of an adjacent memory cell of the second set of memory cells.

14. The method of claim 11, wherein:
the reading and the reprogramming are performed in response to receiving a read command involving the first set of memory cells, after the programming of the second set of memory cells.

15. The method of claim 11, wherein:
the first set of memory cells and the second set of memory cells are in NAND strings, each NAND string is connected to a respective set of latches; and
the reprograming comprises configuring the respective sets of latches, applying a first portion of the plurality of program pulses to the first word line, followed by reconfiguring the respective sets of latches and applying a second portion of the plurality of program pulses to the first word line.

16. An apparatus, comprising:
a first set of memory cells connected to a first word line in a block;
a second set of memory cells connected to a second word line in the block, wherein the first word line is adjacent to the second word line and the first set of memory cells; and
a control circuit, the control circuit is configured to:
  program the first set of memory cells to a set of data states;
  program the second set of memory cells to the set of data states after programming the first set of memory cells;
  read the first set of memory cells and the second set of memory cells;
  based on the reading, identify lower data state memory cells of the first set of memory cells which are adjacent to lower data state memory cells of the second set of memory cells, and higher data state memory cells of the first set of memory cells which are adjacent to higher data state memory cells of the second set of memory cells; and
  reprogram the lower data state memory cells of the first set of memory cells which are adjacent to the lower data state memory cells of the second set of memory cells while inhibiting reprogramming of the higher data state memory cells of the first set of memory cells which are adjacent to the higher data state memory cells of the second set of memory cells.

17. The apparatus of claim 16, wherein:
the lower data state memory cells of the first set of memory cells and the lower data state memory cells of the second set of memory cells comprise a lowest programmed data state of a plurality of data states; and
the higher data state memory cells of the first set of memory cells and the higher data state memory cells of the second set of memory cells comprise a highest data state of the plurality of data states.

18. The apparatus of claim 16, wherein:
the lower data state memory cells of the second set of memory cells are in respective NAND strings connected to respective sets of latches, and comprise memory cells programmed to a first set of data states and memory cells programmed to a second set of data states; and
to perform the reprogramming, the control circuit is configured to store data in the respective sets of latches for reprogramming one portion of the lower data state memory cells of the first set of memory cells, and overwrite the data in the respective sets of latches with data for reprogramming another portion of the lower data state memory cells of the first set of memory cells.

19. The apparatus of claim 18, wherein:
the one portion of the lower data state memory cells of the first set of memory cells are adjacent to memory cells of the second set of memory cells programmed to a first set of data states; and
the another portion of the lower data state memory cells of the first set of memory cells are adjacent to memory cells of the second set of memory cells programmed to a second set of data states.

20. The apparatus of claim 18, wherein:
the one portion of the lower data state memory cells of the first set of memory cells are programmed to a first set of data states; and
the another portion of the lower data state memory cells of the first set of memory cells are programmed to a second set of data states.

* * * * *